United States Patent
Ohtani et al.

(10) Patent No.: US 7,026,193 B1
(45) Date of Patent: Apr. 11, 2006

(54) METHOD OF MANUFACTURING A SEMICONDUCTOR DEVICE HAVING TFTS WITH UNIFORM CHARACTERISTICS

(75) Inventors: Hisashi Ohtani, Kanagawa (JP); Jun Koyama, Kanagawa (JP); Yasushi Ogata, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/455,991

(22) Filed: Dec. 6, 1999

Related U.S. Application Data

(62) Division of application No. 08/998,964, filed on Dec. 29, 1997, now Pat. No. 6,011,275.

(30) Foreign Application Priority Data

Dec. 30, 1996 (JP) .................................. 8-358954
Dec. 30, 1996 (JP) .................................. 8-358955

(51) Int. Cl.
*H01L 21/84* (2006.01)

(52) U.S. Cl. ...................... 438/149; 438/150; 438/166; 438/482; 438/486; 257/59; 257/64; 257/65; 257/66; 257/67; 257/72; 257/347

(58) Field of Classification Search ................ 438/149, 438/150, 166, 486, 482; 257/59, 64–67, 257/72, 347
See application file for complete search history.

(56) References Cited

U.S. PATENT DOCUMENTS

| | | | |
|---|---|---|---|
| 5,403,772 A * | 4/1995 | Zhang et al. ................ | 438/166 |
| 5,529,937 A * | 6/1996 | Zhang et al. ................ | 438/471 |
| 5,534,716 A | 7/1996 | Takemura | |
| 5,569,936 A | 10/1996 | Zhang et al. | |

(Continued)

FOREIGN PATENT DOCUMENTS

JP          07-066425          3/1995

(Continued)

OTHER PUBLICATIONS

O. Schoenfeld et al., "Crystallization of amorphous silicon by NiSi$_2$ precipitates." Thin Solid Films 261 (1995) 236-240.

*Primary Examiner*—Jerome Jackson
*Assistant Examiner*—José R. Diaz
(74) *Attorney, Agent, or Firm*—Fish & Richardson P.C.

(57) ABSTRACT

In a circuit including at least one thin film transistor formed on an insulating substrate, a region 105 to which metal elements that promote crystallinity are added is disposed apart from a semiconductor island region 101 that forms the thin film transistor by a distance y, has a width w, and extends longitudinally over an end portion of the semiconductor island region 101 by a distance x. Also, in a TFT manufactured in a region which is not interposed between the nickel added regions, another nickel added region is disposed (resultantly, which is interposed between two nickel added regions). Further, all the intervals between the respective nickel added regions are preferably identified with each other. Thus, a thin film transistor circuit being capable of a high speed operation (in general, some tens of Mhz and more) is formed. In particular, correcting the difference of crystal growths, using a crystalline silicon film added with nickel, TFTs with uniform characteristics can be provided. Also, a crystal growth distance of a region where is not interposed between the nickel added regions can be sufficient.

70 Claims, 13 Drawing Sheets

U.S. PATENT DOCUMENTS

| | | |
|---|---|---|
| 5,591,987 A | 1/1997 | Yamazaki et al. |
| 5,608,232 A | 3/1997 | Yamazaki et al. |
| 5,614,732 A | 3/1997 | Yamazaki |
| 5,616,506 A * | 4/1997 | Takemura ................... 438/150 |
| 5,627,384 A | 5/1997 | Teramoto et al. |
| 5,639,698 A | 6/1997 | Yamazaki et al. |
| 5,643,826 A * | 7/1997 | Ohtani et al. ........ 148/DIG. 16 |
| 5,646,424 A | 7/1997 | Zhang et al. |
| 5,677,549 A | 10/1997 | Takayama et al. |
| 5,696,003 A | 12/1997 | Makita et al. |
| 5,696,386 A | 12/1997 | Yamazaki |
| 5,717,224 A | 2/1998 | Zhang |
| 5,763,899 A | 6/1998 | Yamazaki et al. |
| 5,814,540 A | 9/1998 | Takemura et al. |
| 5,814,835 A | 9/1998 | Makita et al. |
| 5,818,068 A | 10/1998 | Sasaki et al. |
| 5,821,138 A | 10/1998 | Yamazaki et al. |
| 5,821,562 A | 10/1998 | Makita et al. |
| 5,821,563 A | 10/1998 | Yamazaki et al. |
| 5,869,363 A | 2/1999 | Yamazaki et al. |
| 5,888,858 A | 3/1999 | Yamazaki et al. |
| 5,897,374 A | 4/1999 | Lin |
| 5,922,125 A * | 7/1999 | Zhang ........................... 117/9 |
| 6,027,987 A * | 2/2000 | Yamazaki et al. .......... 438/486 |
| 6,077,731 A * | 6/2000 | Yamazaki et al. .......... 438/150 |
| 6,093,934 A * | 7/2000 | Yamazaki et al. ............ 257/51 |
| 6,100,562 A * | 8/2000 | Yamazaki et al. .......... 257/347 |
| 6,194,254 B1 | 2/2001 | Takemura |
| 6,207,969 B1 | 3/2001 | Yamazaki |
| 6,365,933 B1 | 4/2002 | Yamazaki et al. |
| 6,376,860 B1 * | 4/2002 | Mitanaga et al. .............. 257/57 |
| 6,482,686 B1 | 11/2002 | Takemura |
| 2003/0054595 A1 | 3/2003 | Takemura |

FOREIGN PATENT DOCUMENTS

| | | |
|---|---|---|
| JP | 07-297125 | 11/1995 |

* cited by examiner

METHOD OF MANUFACTURING A SEMICONDUCTOR DEVICE HAVING TFTS WITH UNIFORM CHARACTERISTICS

This is a division of U.S. application Ser. No. 08/998,964, filed Dec. 29, 1997, now U.S. Pat. No. 6,011,275.

BACKGROUND OF THE INVENTION

1. Field of the Invention

The present invention relates to a thin-film transistor circuit and a liquid-crystal display using a thin-film transistor. In particular, the present invention relates to a method of manufacturing a thin-film transistor circuit provided in an SOI where an insulation layer is disposed on an insulation substrate made of glass, quartz or the like, or a mono-crystal.

2. Description of the Related Art

There has been known a technique in which a silicon film having crystallinity is formed on a glass substrate or a quartz substrate, and a thin-film transistor is manufactured with the silicon film.

At present, the integration of a peripheral drive circuit where a drive circuit consisting of TFTs for a liquid-crystal display device is integrally formed in a periphery of a pixel matrix on a substrate instead of an LSI has been developed.

The integration of the drive circuit enables the liquid-crystal display device to be downsized and the costs to be reduced.

In such a construction, the higher speed operation of the peripheral drive circuit has been required.

However, it is difficult to obtain a required high-speed operation in the existing circuit which has been formed of high-temperature polysilicon TFTs and low-temperature polysilicon TFTs.

It has been found that required high-speed drive is obtained by addition of a process for adding metal elements that promote the crystallinity of an amorphous semiconductor layer.

However, the individual thin-film transistors obtained through the above process still suffer from such a problem that their drive speed and electric characteristic are ununiform, etc.

The present invention has been aimed to provide a method of manufacturing a thin-film transistor circuit that requires the above-mentioned high-speed operation (in general, the operation speed of several tens MHz or more).

Up to now, because the metal elements that promote crystallinity are impurities for the thin-film transistors, and cannot be completely removed even though they are removed during a process after crystallization, it has been considered that the addition of the metal elements with the minimum amount as required is desirable.

Under the above circumstances, a metal element added region 105 formed for promoting the crystallinity is so shaped as to be identical with or smaller than a semiconductor island region 101 as shown in FIG. 1B.

The metal elements as added are diffused in the form of an ellipse through a heating process as shown in FIG. 1B, to promote the crystallization of a semiconductor region.

However, the semiconductor island region 101 which has been crystallized in the conventional method as shown in FIG. 1B has a semiconductor region 101 existing in a metal element diffusion region 107. For that reason, a variation in the characteristics of the respective transistors has been found although crystallization is promoted.

The present inventors have investigated a cause of the variation in the characteristics of the transistors. As a result, the present inventors have proved that a direction along which crystal of the semiconductor island region 101 grows is not identical with a direction along which carriers move in the semiconductor island region that constitutes a thin film transistor as it is apart from a metal element added region 106.

Also, in the case of fabricating a TFT using the crystalline silicon film of this type, it is preferable that a direction along which a continuity of a crystal structure extend is made nearly identical with a direction in which a source region is coupled to a drain region.

This is because it is of a structure in which the carriers are most liable to be moved during the operation of the TFT. In other words, the continuity of a lattice structure is substantially kept in the direction along which the continuity of the crystal structure extends so that scattering and trapping of the carriers as moved in the above direction is little generated in comparison with those in other directions.

As mentioned above, the characteristics of the manufactured TFT is determined in accordance with how to take the direction along which the continuity of the crystal structure extends and the direction along which the carriers move, and when both the directions are nearly identical with each other, a TFT which is high in mobility can be obtained.

Therefore, in the case where a circuit that requires a high-speed operation is manufactured using the above TFT, it is important to design the circuit in such a manner that it is arranged taking into consideration a direction of coupling the source region and the drain region of the TFT (a direction in which the carriers move during operation) with respect to a region to which the above-mentioned metal elements such as nickel are added.

In other words, crystal growth is progressed in a direction in parallel to a substrate from the region to which nickel elements are added toward the periphery of that region. This direction is a direction along which the continuity of the crystal structure extends, and the TFT is required to be arranged so that this direction is nearly identical with the direction of coupling the source region and the drain region of the TFT.

As a pattern in which the nickel added region and the TFT are arranged on a substrate as mentioned above, there is proposed an arrangement shown in FIG. 8.

In FIG. 8, TFTs 801 to 808 are disposed at the side of a nickel added region 811 or 812, and an active layer of each TFT is constituted by using a crystalline silicon film (a crystal growth region) which has grown from the nickel added region disposed at a position nearest to the TFT. Arrows indicated by reference numerals 821 to 824 denote directions of crystal growth.

However, a distance of crystal growth depends on a distance between the respective nickel added regions, and the distance of crystal growth tends to be shortened more as the distance between the respective nickel added regions is long. A difference in the distance of growth influences the characteristics of the TFTs.

A large number of circuits of the same type are built in the liquid-crystal display device. In order to drive pixels of several hundreds×several hundreds in the same manner, those large number of circuits of the same type must operate in the same manner. Therefore, the characteristics of the TFTs that constitute the respective circuits need to be unified.

In particular, there is a case where the distance of crystal growth of a silicon film used for an active layer is insufficient, or where crystallinity is insufficient, in the TFTs 801, 802, 807 and 808 formed in regions which are not interposed between the respective nickel added regions. In this case, the mobility of the TFTs 801, 802, 807 and 808 become insufficient.

In other words, comparing the TFT 801 with the TFT 1803, even if they are of the same channel conductive type and of the same dimensions, the TFT 803 reflects that crystallinity is excellent and has the characteristics suitable for high-speed operation as much, and the other TFT 801 reflects that crystallinity is not excellent and has the characteristics unsuitable for high-speed operation.

In the case of fabricating a circuit that requires high-speed operation using the above TFT, there is a case where a sufficient operation speed cannot be obtained because of a poor balance of the element characteristics.

SUMMARY OF THE INVENTION

The present invention has been made in view of the above circumstances, and therefore an object of the present invention is to provide a TFT uniform in characteristics by using a crystalline silicon film fabricated by correcting a difference of crystal growth and utilizing nickel addition. In particular, the present invention relates to a technique by which a crystal growth state in a region which is not interposed between nickel added regions is improved.

In order to achieve the above object, according to one aspect of the present invention, there is provided a semiconductor device which comprises:

a circuit having at least one thin film transistor formed on an insulating substrate;

wherein an active layer of said thin film transistor is constituted by using a region where crystal grows in parallel to a substrate from a region to which metal elements that promote crystallization of silicon having a longitudinal shape are added;

wherein a longitudinal direction of the region to which the metal elements are added is identical or nearly identical with a direction of moving carriers in the active layer; and wherein the region to which the metal elements are added extends longer over an end portion of the active layer.

In the above construction, it is important that the active layer is disposed within a region where the metal elements are linearly diffused from the region to which the metal elements are added during a crystallizing process. In other words, it is important to form the active layer utilizing not a region where crystal grows radially (that is, two-dimensionally) as shown in FIG. 1B but a region where crystal growth is uniformly and linearly directed to one orientation in parallel as shown in FIG. 1A.

The metal elements that promote the crystallization of silicon may consist of one or plural kinds of elements selected from Fe, Co, Ni, Ru, Rh, Pd, Os, Ir, Pt, Cu and Au.

Also, according to another aspect of the present invention, there is provided a method of manufacturing a semiconductor device, said method comprising the steps of:

forming an amorphous silicon film on a substrate having an insulating surface;

forming a metal element added region where metal elements that promote the crystallization of silicon which is longitudinally shaped is added on said amorphous silicon film; and conducting a heat treatment to allow crystal to grow in parallel to said substrate from said metal element added region;

wherein said metal element added region extends longitudinally over an end portion of a semiconductor active layer pattern which will be formed in a post-process by a predetermined distance.

In the present invention, there is provided a metal element added region 105 as shown in FIG. 1A. Reference numeral 101 denotes a semiconductor region; 102, a source line; 103, a gate line; and 104, a drain line.

In other words, in a circuit having at least one thin film transistor formed on an insulating substrate, the metal element added region 105 is disposed apart from a semiconductor island region 101 that forms said thin film transistor by a distance y, has a width w, and extends longitudinally over an end portion of the semiconductor island region 101 by a distance x.

According to the present invention, during a process of selectively introducing the metal elements that promote the crystallization of silicon into a part of the amorphous silicon film, the metal element added region 105 formed through a mask having an opening portion is disposed apart from the semiconductor island region 101 by the distance y, has the width w and is shaped to be longer toward a longitudinal direction thereof over the end portion of the semiconductor island region 101 by the distance x.

It is desirable that the distance x by which the metal element added region 105 extends longitudinally from the end portion of the semiconductor island region 101 in the present invention is set to at least 100 µm or more.

However, in the case where it cannot be set to 100 µm or more from the viewpoint of the circuit wiring, the distance x may be set within the possible limits.

It is desirable that the distance y between the semiconductor island region 101 and the metal element added region 105 is set to 10 µm or more. However, in the case where it cannot be set to 10 µm or more from the viewpoint of the circuit wiring, the distance y may be set within the possible limits.

Also, it is desirable that the width w of the metal element added region 105 is set to about 10 to 20 µm.

With the above structure, the metal elements diffuse as indicated by reference numeral 108 in FIG. 2A, and promote the crystallization of the amorphous silicon film during a amorphous silicon film crystallizing process after the formation of the metal element added region.

With the above structure, the entire silicon film whose crystallization has been promoted has a crystal structure having a continuous and linear crystal grains in a direction indicated by an arrow in FIG. 2A.

Also, as shown in FIG. 2B which is a cross-sectional view taken along a line b–b' of FIG. 2A, crystal growth progresses in parallel to the substrate.

The crystal growth progresses from the metal element added region 105 toward the periphery thereof linearly toward the direction indicated by the arrows. According to the present invention, a region where the crystal growth progresses linearly is broadened in such a manner that the crystal grains in the entire semiconductor island region are directed to the same orientations with respect to the metal element added region.

The crystal growth in parallel to the substrate is called "lateral growth".

Then, it is desirable that the metal element added region 105 is disposed so that the semiconductor island region 101 is disposed within the region where the metal elements linearly diffuse.

Also, if the distance x is set to 50% or more of the crystal growth distance, the region where the semiconductor island region 101 is formed can be made the region where the crystal growth linearly progresses.

Also, a higher-speed operation can be expected if a direction of moving the carriers in the semiconductor island region 101 that constitutes the thin film transistor (a carrier moving direction as a whole) is substantially identical with a direction of the continuity of the crystal structure.

It should be noted that in the case where a plurality of thin film transistors are continuously disposed in series or in parallel, a metal added region having a width w may be provided which extends longitudinally from an end portion of the semiconductor island region of the thin film transistor which is situated at its endmost by an interval y and a distance x.

The metal added region according to the present invention is removed through a process of removing the metal elements after crystallization.

However, because metal elements are added to a portion close to the opening portion so as to be liable to be etched, a shape mark of the metal added region remains by over-etched as shown in FIG. 3C.

It is presumed that a larger amount of metal elements for promoting crystallinity remain in the vicinity of the mark having a shape of the opening portion in comparison with other places. If wiring is formed on the mark after removal of the metal elements, diffusion caused by the process after the removal of the metal elements can be prevented.

As one method of obtaining the crystalline silicon film according to the present invention, the following method is recommended. That is, metal elements that promote the crystallization of silicon which is represented by nickel are introduced into an amorphous silicon film, a heat treatment is then conducted on the amorphous silicon film, and thereafter a heat treatment is conducted on the film under an atmosphere containing halogen elements therein, to thereby obtain a crystalline silicon film.

The most preferable one of the above metal elements is nickel from the viewpoints of reproducibility and advantages. In general, the metal elements of this type can consist of one or plural kinds of elements selected from Fe, Co, Ni, Ru, Rh, Pd, Os, Ir, Pt, Cu and Au.

In the case of employing the nickel elements, the concentration of nickel that finally remains in a silicon film is about $1 \times 10^{14}$ atm/cm$^3$ to $5 \times 10^{18}$ atm/cm$^3$ in the existing circumstances, but more preferable as it is low. Researching the best conditions of gettering a thermal oxide film, the upper limit of the concentration can be reduced up to about $5 \times 10^{17}$ atm/cm$^3$. The measurement of the concentration can be performed employing an SIMS (secondary ion mass spectroscopy).

In general, the lower limit of the above concentration of nickel is about $1 \times 10^{16}$ atm/cm$^3$. This is because it is normally difficult to remove the influence of nickel which is attached to the substrate or the device from the viewpoint of the costs.

Hence, in the normal manufacturing process, the concentration of remaining nickel elements is $1 \times 10^{16}$ atm/cm$^3$ to $5 \times 10^{17}$ atm/cm$^3$.

Also, during a process of manufacturing a thermal oxide film, the distribution of the concentration of nickel elements in a thickwise direction of the crystalline silicon film as obtained is sloped or distributed because the metal elements move in the thermal oxide film.

In general, it has been observed that the concentration of the metal elements in the crystalline silicon film tends to be heightened toward an interface where the thermal oxide film is formed. Also, it has been observed that the concentration of the metal elements tends to be heightened toward a substrate or an underlayer, that is, toward an interface of a reverse side of the thermal oxide film depending on conditions.

Further, in the case where halogen elements are contained in the atmosphere at the time of forming the thermal oxide film, the halogen elements also exhibit the same concentration distribution as that of the above metal element. That is, the distribution of the concentration exhibits such that the concentration of the contents is heightened toward a front surface and/or a rear surface of the crystalline silicon film.

The crystalline silicon film according to the present invention is set preferably to 100 Å to 750 Å, more preferably to 150 Å to 450 Å in final thickness. With this thickness, the singular crystal structure where crystallinity is linearly continuous can be obtained with an excellent reproducibility and with a more remarkable form.

The final thickness of the crystalline silicon film need to be determined taking into consideration that the thickness is reduced by formation of the thermal oxide film.

As a method of introducing the metal element, there are a method of coating a solvent containing the metal elements, a method using a CVD method, a method using a sputtering method or a vapor deposition method, a method conducting a plasma processing using an electrode containing the metal, and a method using a gas adsorbing method.

As a method of introducing the halogen elements, there can be used means for allowing HCl, HF, HBr, $Cl_2$, $F_2$, $Br_2$, $CF_4$ and so on to be contained in an oxidizing atmosphere (for example, oxygen atmosphere).

It is also effective that hydrogen gas is additionally introduced in the atmosphere at the time of forming the thermal oxide film to employ the action of wet oxidation.

A temperature at which the thermal oxide film is formed is very important. In the case of obtaining a TFT that can conduct the operation of several tens MHz or more by a single element and has an S value of 100 (mV/dec) or less, a heating temperature at the time of forming the thermal oxide film need to be set to preferably 800° C. or more, more preferably 900° C. or more.

The upper limit of the heating temperature is properly set to about 1,100° C. which is the upper limit of the heat-resistant temperature of a quartz substrate.

Further, according to still another aspect of the present invention, there is provided a method of manufacturing a semiconductor device, said method comprising the steps of:

forming an amorphous silicon film on a substrate having an insulating surface;

selectively introducing metal elements that promote the crystallization of silicon into a plurality of regions of said amorphous silicon film; and conducting a heat treatment to allow crystal to grow in parallel to said substrate from said plurality of regions into which the metal elements have been selectively introduced;

wherein at least one of said regions into which the metal elements have been selectively introduced is not used for formation of an element but provided for controlling crystal growth states of other regions into which the metal elements have been selectively introduced.

In the above construction, the metal elements that promote the crystallization of silicon can consist of one or plural kinds of elements selected from Fe, Co, Ni, Ru, Rh, Pd, Os, Ir, Pt, Cu and Au.

In particular, an element that can obtain a high effect and a high reproducibility is nickel (Ni).

In the above construction, it is preferable that the introduction of the metal elements is conducted by an ion implanting method, or by coating a solvent in which metal elements are dissolved or dispersed.

According to yet still another aspect of the present invention, there is provided a semiconductor device disposed on a substrate having an insulating surface, said semiconductor device comprising:

an active layer formed of a crystalline silicon film where crystal grows in parallel to or substantially in parallel to the substrate from one of a plurality of regions to which metal elements that promote the crystallization of silicon are added;

wherein a crystal growth region where crystal grows from another one of said plurality of regions is not used as an active layer of the semiconductor device.

For example, as shown in FIG. 7, nickel added regions 701 to 704 are disposed at given intervals, and thin film transistors are structured using crystal growth regions from the regions 702 and 703. In the figure, arrows 721 to 728 denote crystal growth.

In the above way, with the arrangement of the nickel added regions 701 and 704, a crystal growth distance of crystalline silicon films that form the active layers of TFTs 711, 712, 717 and 718 can be made nearly identical with a crystal growth distance of crystalline silicon films that form the active layers of TFTs 713 and 714.

In this example, the nickel added regions 701 and 704 are not provided for the purpose of crystallizing the amorphous silicon film. The nickel added regions 701 and 704 are provided for making the distance and crystal growth states of the crystal growth 723 and 726 identical with the states of the crystal growth 724 and 725. In other words, they are provided as a dummy regions for controlling the crystal state of another crystal growth region although being not finally utilized.

Therefore, no region where crystal growth was progressed from the nickel added regions 701 and 704 is utilized for formation of an element.

What is important is that the crystal growth from the nickel added regions 701 and 704 intentionally and preferably influences other crystal growth regions used for formation of the elements.

In other words, the crystal growth from the nickel added regions 701 and 704 is to control the crystal growth state of other crystal growth regions used for formation of the element.

In the above way, with the provision of the dummy nickel added regions 701 and 704, the distance and the crystal state of the crystal growth in the crystalline silicon film regions for formation of the TFTs 711 to 718 can be controlled to uniform the characteristics of the respective TFTs.

In this example, it is preferable that the intervals between the respective nickel added regions are unified. This is because the crystal growth distance is varied even depending on a width of the nickel added region whereby the design parameters are increased.

DETAILED DESCRIPTION OF THE PREFERRED EMBODIMENTS

First Embodiment

Figure 3A:
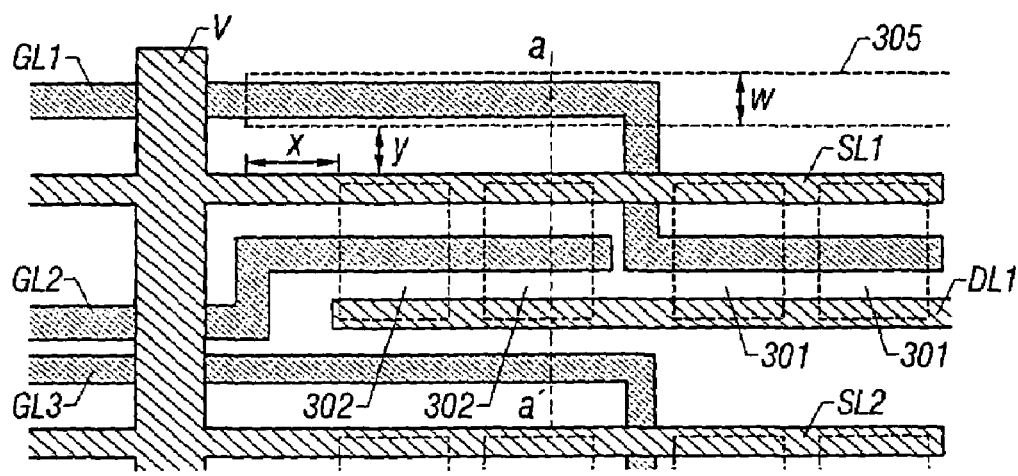
FIGS. 3A, 3B and 3C are diagrams of the first embodiment.

FIG. 3A shows a case in which a switch circuit made up of thin film transistors is applied to a drive circuit of a liquid-crystal display device in accordance with one embodiment of the present invention. This embodiment exemplifies a part of an analog switch circuit and a wiring structure in the periphery of an image signal line.

A switch circuit such as an analog switch requires that an image signal is written in a data line in a short time, and for that reason, high-speed operation is required.

In the conventional high-temperature polysilicon TFT and low-temperature polysilicon TFT, because they are poor in crystallinity in comparison with a monocrystal MOSFEF, it was difficult to obtain required high-speed operation when constituting the switch circuit such as the analog switch.

A semiconductor region in the thin film transistor circuit according to the present invention is characterized in that a metal added region is extended from the semiconductor region by a distance x, to thereby make the grain boundary of the entire semiconductor region more linear.

In this embodiment, distance x=100 $\lambda$m, interval distance y=10 μm and width w=10 μm are set.

In FIG. 3A, x is substantially identical in length with y and w, but it is merely reduced for construction.

Because the semiconductor region according to the present invention is designed such that its crystallization is directed to one orientation in comparison with the conventional high-temperature polysilicon TFT and low-temperature polysilicon TFT, the same high-speed operation as that of the monocrystal MOSFET can be obtained.

FIG. 3A exemplifies a partial top view of a layout of a data line drive circuit on the substrate in the periphery of the image signal line.

Figure 3B:
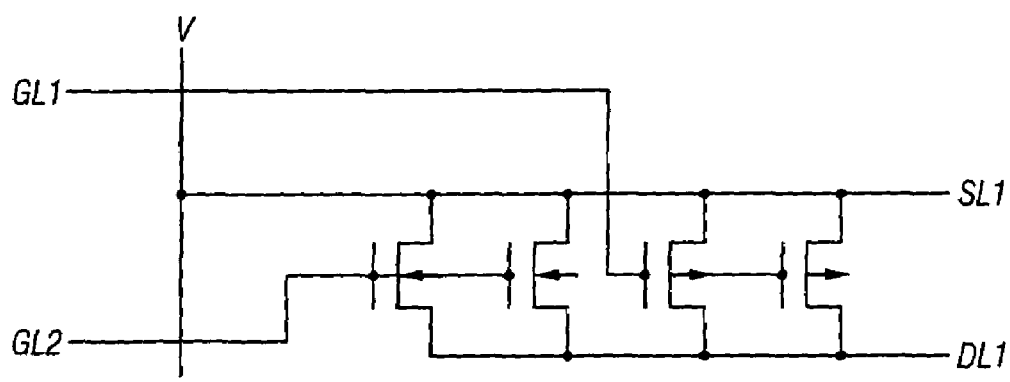
Figure 3C:
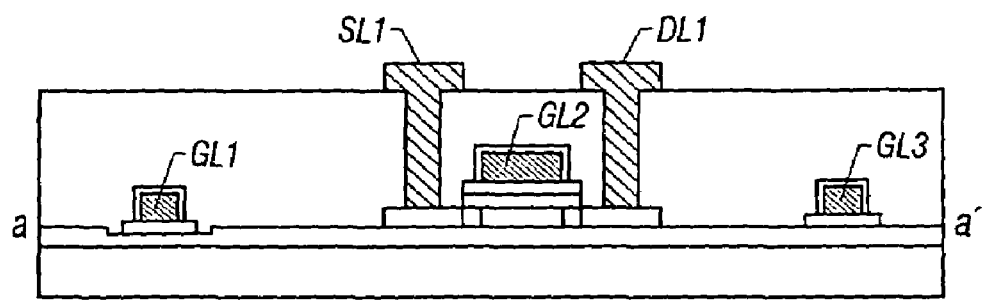

FIG. 3C is a cross-sectional view taken along a line a—a' of FIG. 3A.

An image signal line V is connected to lead wirings SL1, SL2 and also a data line DL1 through a p-type semiconductor region 301 or an n-type semiconductor region 302.

The image signal line V is designed such that the lead wiring SL1 is electrically connected to the wiring DL1 through a contact hole of the semiconductor with only a necessary image signal.

FIG. 3B is an equivalent circuit diagram of FIG. 3A.

In this embodiment, two p-channel type TFTs are connected in series, two n-channel type TFTs are connected in series, and a p-channel type TFT group and an n-channel type TFT group are combined together in parallel and connected as shown in FIG. 3B.

With this structure, an analog switch circuit is formed which complementarily operates in such a manner that upon turning one transistor group on, the other transistor group is turned off.

In this example, two TFTs are connected in series, but, the number of TFTs may be more than two, that is, a large number, or one. It is needless to say that the TFTs are arranged with the size and the number thereof which can withstand the deterioration of the characteristics.

The analog switch circuit conducts the operation of switching a high resistance and a low resistance according to a timing which is applied to switch circuit drive gate lines GL1 and GL2 to which a bit signal outputted from a drive timing control section is supplied.

Through the analog switch circuit that complementarily operate as mentioned above, only necessary image signal inputted to the image signal line V is electrically connected to the data wiring DL1. Thereafter, the signal is transmitted to the respective pixels and displayed on a screen.

Second Embodiment

A process of manufacturing the structure of the above embodiment will be described hereinafter.

First, a silicon oxide film is formed in thickness of 3,000 Å on a quartz substrate 401 as an under film 402. If the surface of the quartz substrate is excellent in smoothness and also satisfactorily cleaned, the under film 402 is not particularly required.

Under the existing circumstances, it is a preferable choice to use the quartz substrate as a substrate, however, if it is an insulating substrate that can withstand a heat treatment temperature, the substrate is not limited to quartz.

Then, an amorphous silicon film 403 which is a starting film of a crystalline silicon film is formed in thickness of 600 Å through a low pressure CVD method. It is preferable that the thickness of the amorphous silicon film is set to 2,000 Å or less.

Thereafter, a silicon oxide film not shown is formed in thickness of 1,500 Å and then patterned to form a mask denoted by reference numeral 404. The mask 404 is opened in a region 405. In the region where an opening 405 is defined, the amorphous silicon film 403 is exposed.

The opening 405 is shaped in a slender rectangle which is longitudinal backward and frontward of the drawing. It is proper that a width of the opening 405 is set to 10 µm or more. Also, an end portion of the opening 405 is designed such that it is apart from an active layer region which will be formed in a post-process by the distance x.

Nickel acetate solution containing nickel elements of 10 ppm in weight conversion therein is coated on the surface. Then, spin dry is conducted using a spinner not shown to remove a surplus solution.

Figure 4A:
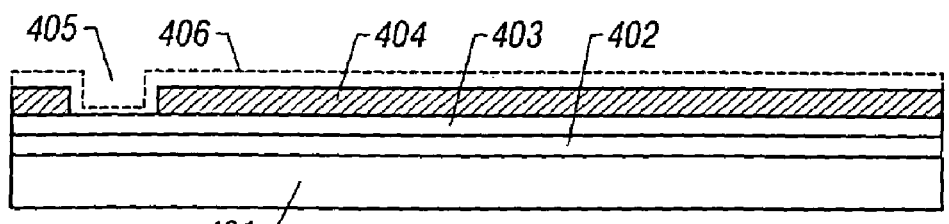
FIGS. 4A, 4B, 4C and 4D are diagrams showing a process manufacturing a thin film transistor of the second embodiment.

In the above manner, a state in which the nickel elements exist in a state indicated by a dotted line 406 of FIG. 4A is obtained. In this state, the nickel elements are held selectively in contact with a part of the amorphous silicon film on a bottom of the opening 405.

The introduction of nickel elements may be conducted through the ion implanting method. In this case, a position at which the nickel elements are introduced can be controlled with higher accuracy in comparison with a case in which a nickel element solution is coated on the surface. Therefore, this is effective particularly in a case where a width of a region into which the nickel elements are introduced is extremely narrow to the degree of several µm or less, or in a case where a shape of the introduced region is complicated.

Figure 4B:
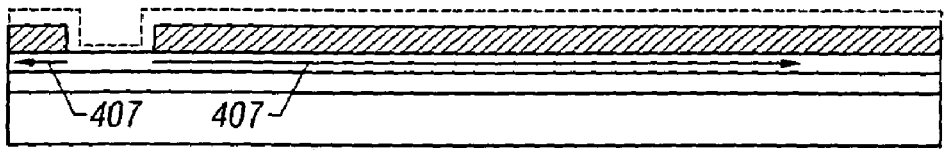

Subsequently, a heat treatment is conducted at 500 to 630° C., for example, 600° C. for 8 hours in a nitrogen atmosphere containing hydrogen of 3% but little of oxygen. With this process, crystal growth is progressed in parallel to the substrate 401 as indicated by reference numeral 407 in FIG. 4B.

The crystal growth is progressed from a region of the opening 405 into which the nickel elements are introduced (metal added region) toward a periphery thereof.

The surface of the crystalline silicon film which has grown laterally by the crystal growth is very excellent to smoothness in comparison with the conventional low-temperature polysilicon or high-temperature polysilicon. It is presumed that this is caused by the fact that a direction along which the grain boundary extends is substantially unified.

The general silicon film which is called polycrystal silicon or polysilicon is ±100 Å or more in the roughness of its surface. However, in the case of making crystal laterally grow as in this embodiment, it has been observed that the roughness of its surface is ±30 Å or less. Since the roughness of the surface deteriorates the characteristics of the interface between the silicon film and the gate insulating film, it is preferably as small as possible.

In heat treatment conditions for the above crystallization, the lateral growth can be conducted over 100 µm or more. Thus, a crystalline silicon film 408 having a laterally grown region.

The heat treatment for crystal growth can be conducted at 450 to 1,100° C. (the upper limit is regulated by the heat resistivity of the substrate). If a certain lateral growth distance is ensured, it is preferable that the temperature of the heat treatment is set to 600° C. or more. However, an improvement in the crystal growth distance and the crystallinity when the temperature is allowed to rise higher than that temperature does not increase so much.

Figure 4C:
Figure 4D:
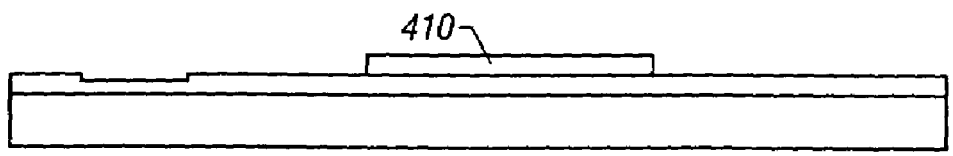

Then, the mask 404 which is formed of the silicon oxide film for selectively introducing the nickel elements is removed. Thus, a state shown in FIG. 4C is obtained.

In this state, the nickel elements are segregated in the crystalline silicon film 408. In particular, the nickel elements exist with a relatively high concentration in the region where the opening 405 is defined and a top portion of the crystal growth which is indicated by reference numeral 407.

In the regions where the nickel elements are segregated in the film, an orientation of the crystal growth is disordered.

Therefore, in formation of the active layer, it is important to prevent those regions. That is, it is important to prevent the regions in which the nickel elements are segregated from existing in the active layer.

Also, there is designed such that wiring is formed on the region where the opening 405 has been defined.

After the state shown in FIG. 4C is obtained, a laser beam is applied to the surface. In other words, crystallization may be further promoted by the application of a laser beam. The application of the laser beam has an effect of diffusing a lump of nickel elements which exist in the film so as to be liable to remove the nickel elements later. Even if a laser beam is applied at this stage, the lateral growth is not further progressed.

The laser beam can be obtained by using an eximer laser having a wavelength of an ultraviolet region. For example, an KrF eximer layer (248 nm in wavelength) or an XeCl eximer laser (308 nm in wavelength) can be used.

Thereafter, a heat treatment is conducted at 950° C. under an oxygen atmosphere containing halogen elements therein, for example, an oxygen atmosphere containing HCl of 3 volume % to form a thermal oxide film 409 having a thickness of 200 Å. With the formation of the thermal oxide film, the thickness of silicon film 408 is reduced about 100 Å. In other words, the thickness of the silicon film becomes about 500 Å.

During the above process, with the formation of the thermal oxide film, the silicon elements having an unstable bonding state in the film is used for the formation of the thermal oxide film. Then, defects in the film are reduced, thereby being capable of obtaining higher crystallinity.

At the same time, the formation of the thermal oxide film and the gettering of the nickel elements from the film due to the action of chlorine are conducted.

It is needless to say that the nickel elements are taken in the thermal oxide film with a relatively high concentration. Then, the nickel elements in the silicon film 408 are relatively reduced.

After the formation of the thermal oxide film 409, the thermal oxide film 409 is removed. As a result, a crystalline silicon film 408 having the reduced concentration of the nickel elements contained therein is obtained. The crystalline silicon film thus obtained has a structure in which a crystal structure extends in one direction (this direction is identical with an orientation of crystal growth). In other words, a plurality of slender cylindrical crystals are structured to be aligned in parallel through a plurality of grain boundaries that extend in one direction. Oxygen and chlorine are segregated in the grain boundaries that extend in one direction (this direction is identical with an orientation of crystal growth).

Then, patterning is conducted to form a pattern 410 which is formed by a lateral growth region. The island region 410 will be formed into an active layer of the TFT later.

In this situation, the region where the opening 405 is formed is liable to be etched because it contains the nickel elements more than other regions with the result that the silicon oxide film which is an under film is over-etched.

In this process, a pattern is positioned in such a manner that a direction connecting the source region and the drain region is identical with or nearly identical with an orientation of crystal growth. With this process, a direction of moving carriers can be identical with a direction along which crystal lattices continuously extend as a result of which a TFT having a high characteristic can be obtained.

Figure 5A:
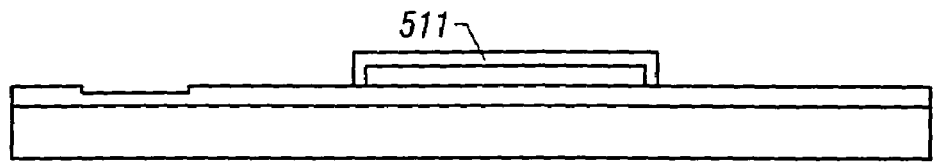
FIGS. 5A–5D are diagrams showing a process manufacturing the thin film transistor of the second embodiment.

Then, after the formation of the pattern 410, a thermal oxide film 511 is formed in thickness of 300 Å (FIG. 5A). This thermal oxide film 511 is obtained by conducting a heat treatment of 950° C. in an oxygen atmosphere containing HCl of 0.1 to 10 volume %, for example, 3% therein.

With the formation of the thermal oxide film 511, the thickness of the pattern (a pattern which is formed into an active layer) 410 becomes 350 Å.

In this process, the same effect as the case of forming the thermal oxide film 409 can be obtained. The thermal oxide film 409 is formed into a part of the gate insulating film of the TFT.

Figure 5B:

Thereafter, a silicon oxide film 515 that constitutes the thermal oxide film and the gate insulating film is formed in thickness of 1,000 Å through the plasma CVD method (FIG. 5B).

Then, an aluminum film for forming a gate electrode is formed in thickness of 4,000 Å through the sputtering method. Scandium of 0.2 weight % gets contained in the aluminum film.

The reason why scandium is contained in the aluminum film is to suppress the occurrence of hillock or whisker during a post-process. The hillock and whisker are directed to a needle-shaped or shaped projection which is caused by abnormal growth of aluminum during heating.

A material used for forming the gate electrode other than aluminum may be tantalum (Ta), polycrystal silicon which is doped with a large amount of phosphorus (P), silicide of tungsten (WSi), or a lamination layer or mixture of polycrystal silicon which is doped with phosphorus and silicide of tungsten.

After the formation of the aluminum film, a fine anodic oxide film not shown is formed. The anodic oxide film is formed in an ethylene glycol solution containing tartaric acid of 3% therein as an electrolyte with aluminum as an anode and platinum as a cathode. In this process, the anodic oxide film having a fine quality is formed in thickness of 100 Å on the aluminum film.

The fine anodic oxide film not shown serves to improve an adhesion to a resist mask which will be formed later.

The thickness of the anodic oxide film can be controlled according to supply voltage during anodic oxidation.

Figure 5C:
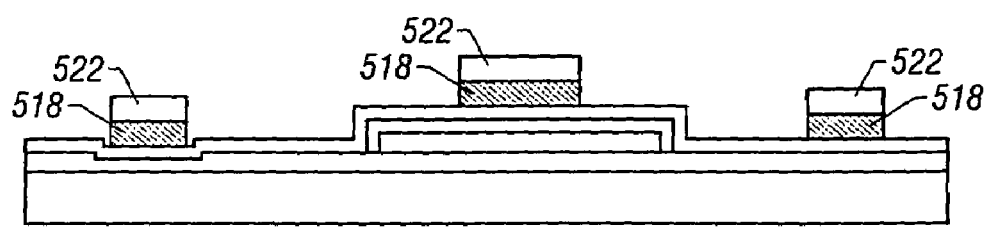

Subsequently, a resist mask 522 is formed. Then, using the resist mask 522, the aluminum film is patterned into a pattern 518. Thus, a state shown in FIG. 5C is obtained.

In this stage, anodic oxidation is again conducted. In this situation, oxalic acid aqueous solution of 3% is used as an electrolyte. In the electrolyte, anodic oxidation is conducted with the aluminum pattern 518 as an anode, to thereby form a porous anodic oxide film 519.

In this process, the porous anodic oxide film 519 is selectively formed on the side surfaces of the aluminum pattern because the high-adhesive resist mask 522 exists on the upper side.

The porous anodic oxide film can be allowed to grow up to several μm in thickness. In this example, the thickness of the porous anodic oxide film is set to 6,000 Å. The growth distance can be controlled according to an anodic oxidizing time.

Then, the resist mask 522 is removed. Thereafter, a fine anodic oxide film is again formed. In other words, anodic oxidation is again conducted in the above-mentioned ethylene glycol solution containing tartaric acid of 3% therein.

In this process, an anodic oxide film 520 having a fine quality is formed because the electrolyte enters the porous anodic oxide film 519.

The thickness of the fine anodic oxide film 520 is set to 1,000 Å. The thickness of the anodic oxide film can be controlled according to supply voltage.

In this situation, the exposed silicon oxide film 515 is etched. At the same time, the thermal oxide film 511 is etched. The etching as used is a dry etching. Then, using a mixed acid where acetic acid, nitric acid and phosphoric acid are mixed together, the porous anodic oxide film 519 is removed. Thus, a state shown in FIG. 5D is obtained.

Figure 5D:
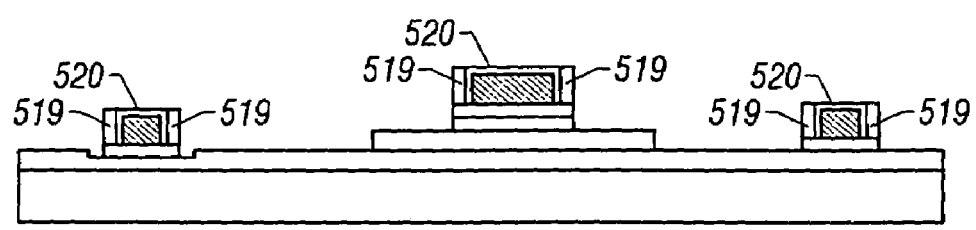

After the state shown in FIG. 5D is obtained, impurity ions are implanted. In this process, in order to fabricate an n-channel type thin film transistor, P (phosphorus) ions are implanted through the plasma doping method.

In this process, regions 630 and 634 which are heavy-doped and regions 631 and 633 which are light-doped are formed. This is because the remaining silicon oxide film 515 functions as a semi-transparent mask, and a part of the implanted ions is shielded by the film 515.

Then, a laser beam (or an intense light by a lamp) is applied to activate the region into which the impurity ions are implanted. Thus, a source region 630, a channel formation region 632, a drain region 634 and low concentration impurity regions 631, 633 are formed in a self-aligning manner.

Figure 6A:
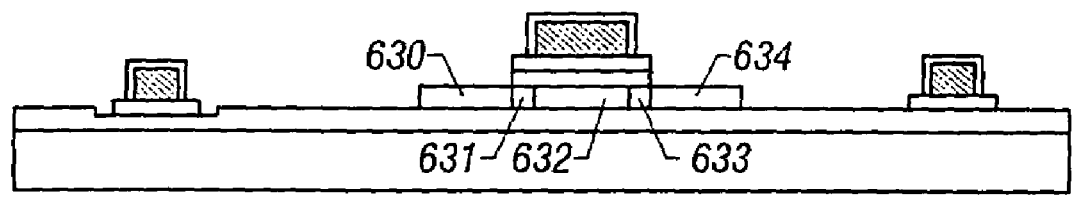
FIGS. 6A and 6B are diagrams showing a process manufacturing the thin film transistor of the second embodiment.

In this example, what is denoted by reference numeral 633 is a region which is called "an LDD (light dope drain) region" (FIG. 6A).

In the case where the thickness of the fine anodic oxide film 510 is thickened to 2,000 Å or more, offset gate regions can be formed by this thickness outside of the channel formation region 632.

Similarly, in this embodiment, the offset gate region is formed. However, since its dimensions are small such that a contribution of the offset gate region is small, and also the drawings are complicated, the offset gate region is omitted from the drawing.

In order to make the anodic oxide film having the fine quality thicker to the degree of 2,000 Å or more, since a supply voltage of 200 V or higher is required, attention must be paid to reproducibility and safety.

Subsequently, a silicon oxide film, a silicon nitride film or a lamination film consisting of those films is formed as an interlayer insulating film 640. The interlayer insulating film 640 may consist of a layer which is made of a resin material on a silicon oxide film or a silicon nitride film.

Figure 6B:
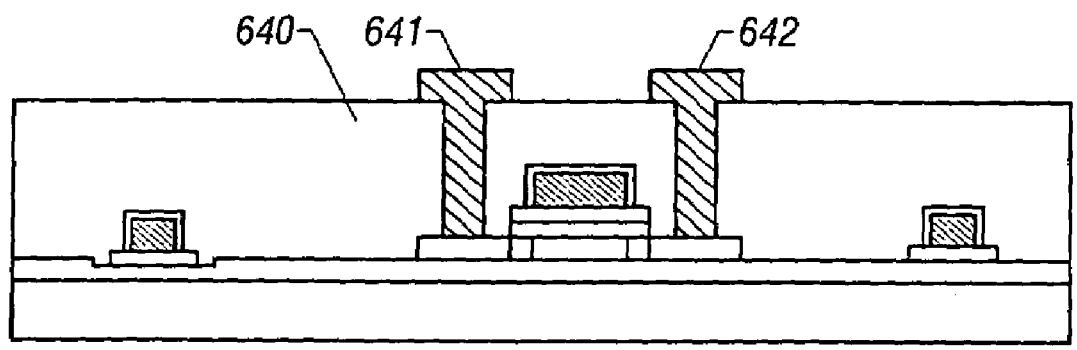
Figure 7:
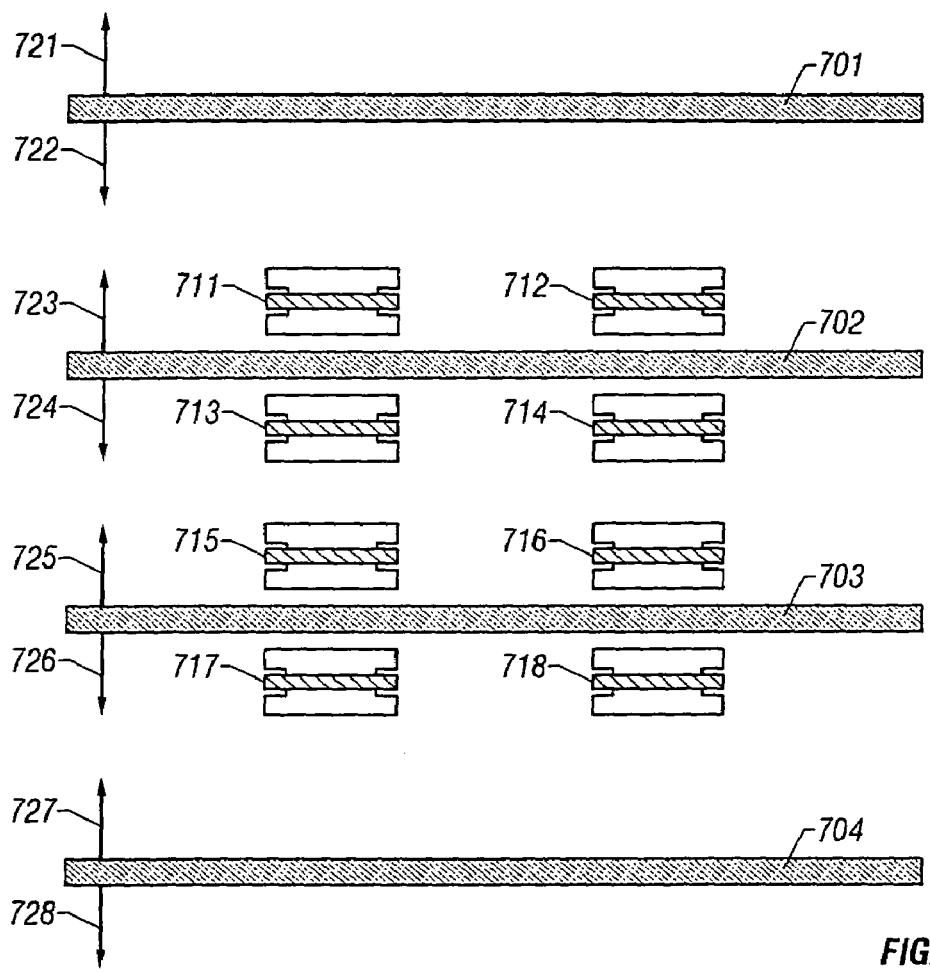
FIG. 7 is a diagram showing an arrangement of nickel added regions and TFTs according to the present invention.
Figure 8:
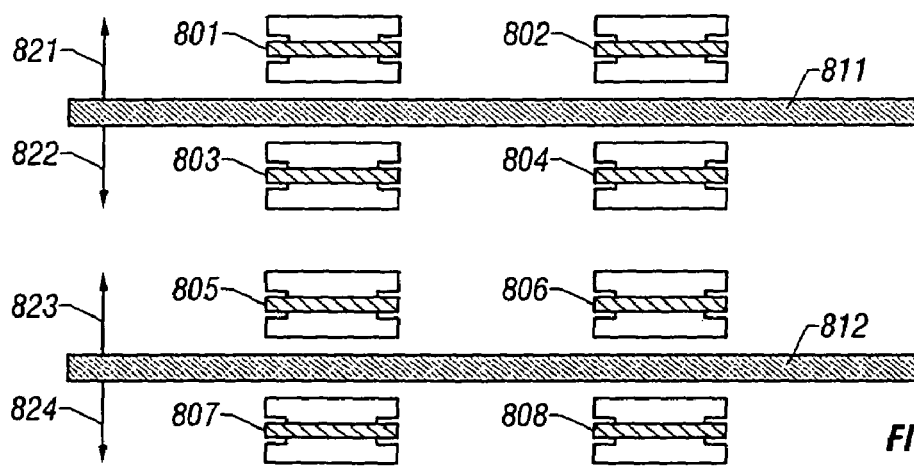
FIG. 8 is a diagram showing an arrangement of nickel added regions and TFTs in the conventional example.

Then, contact holes are formed so that a source electrode 641 and a drain electrode 642 are formed. Thus, a thin film transistor shown in FIG. 6B is completed.

The TFT according to this embodiment can obtain an extremely high characteristic which could not be obtained by the conventional TFT.

For example, an NTFT (n-channel type TFT) as manufactured can obtain a high performance such as the mobility of 200 to 300 (cm$^2$/Vs) and the S value of 75 to 90 (mV/dec) (VD=1 V). A PTFT (p-channel type TFT) as manufactured can obtain a high performance such as the mobility of 120 to 180 (cm$^2$/Vs) and the S value of 75 to 100 (mV/dec) (VD=1 V).

In particular, the S value is a wonder excellent value which is ½ or less of that in the conventional high-temperature polysilicon TFT and low-temperature polysilicon TFT.

The TFT thus manufactured can conduct the operation of 1 GHz in a ring oscillator level and the operation of 100 MHz in the shift register level when a voltage of the drive signal is 3.3 to 5 V.

Also, the thin film transistor employing the crystalline silicon film having the above singular crystal structure is characterized in that the crystal structure makes it hard to exhibit the short channel effect. Also, it is characterized in that since an insulator is used as a substrate, there rises no problem on the capacity of the substrate, and it is suitable for high-speed operation.

The conventional MOS transistor using a monocrystal silicon wafer has a scaling rule. This is that as the dimensions of the transistor are made small in accordance with a predetermined rule, the performance of the transistor is enhanced in accordance with the predetermined rule.

However, under the circumstances where the fining of the transistors has been greatly advanced in recent years, it becomes difficult to enhance the performance of the transistor in accordance with that scaling rule.

As one example, as a channel length is shortened to suppress the short channel effect, a fine measure such that a portion along the channel is doped with impurities is required, thereby more increasing the difficulty in a manufacture process.

However, in the case of using a crystalline silicon film having such a singular crystal structure, a required characteristic can be obtained by the dimensions which are not complied with the above scaling rule.

It is presumed that this is caused by items stated below.

1) A direction along which a columnar crystal extends is identical with a direction of moving carriers in the channel, to thereby suppress the short channel effect.

2) An insulator is employed for a substrate, to thereby greatly suppress a problem on the capacity.

3) Since the gate electrode can be made of aluminum, it is advantageous in the high-speed operation.

In the item 1), the following can be presumed. That is, each columnar crystal structure is partitioned by an inactive grain boundary. Since the grain boundary portion is high in energy level, the movement of the carriers is regulated along the crystal extending direction. Also, in the same way, the spread of a depletion layer into the interior of the channel from the source and drain regions is suppressed. It is presumed that this suppresses the short channel effect.

Specific examples in which the characteristics are not complied with the above-mentioned scaling rule are stated below.

For example, in the case where the thickness of the gate insulating film must be 100 Å in accordance with the conventional scaling rule, if a crystalline silicon film according to the present invention is used, the same characteristics can be obtained with the thickness of the gate insulating film being 300 Å. As a result, the static electricity resistant characteristic can be enhanced.

It is understood that this is caused by the above items 1) to 3).

Also, not only the thickness of the gate insulating film but also the channel length can provide a predetermined characteristic under the condition more lenient than the conventional scaling rule (condition lower one rank).

This is useful in the case where the semiconductor circuit that enables high-speed operation is manufactured over large area at the low costs.

Third Embodiment

In this embodiment, a description will be given of a process of manufacturing a TFT using a crystalline silicon film with a crystal structure having the continuity along a predetermined direction and a grain boundary extending along the above predetermined direction with reference to an arrangement relation to a nickel added region.

FIGS. 9A to 11B show a process of manufacturing a TFT in accordance with this embodiment.

First, a silicon oxide film is formed in thickness of 3,000 Å on a quartz substrate 901 as an under film 902. If the surface of the quartz substrate is excellent in smoothness and also satisfactorily cleaned, the under film 902 is not required.

Under the existing circumstances, it is preferable to use the quartz substrate as a substrate, however, if it is a substrate that can withstand a heat treatment temperature, the substrate is not limited to quartz.

Then, an amorphous silicon film 903 which is a starting film of a crystalline silicon film is formed in thickness of 500 Å through a low pressure CVD method.

Thereafter, a silicon oxide film not shown is formed in thickness of 1,500 Å and then patterned to form a mask denoted by reference numeral 904. The mask is opened in regions 905 to 907. In the regions where the opening 905 to 907 are defined, the amorphous silicon film 903 is exposed.

The opening 907 is a dummy opening for a nickel added region.

The openings 905 to 907 are shaped in a slender rectangle which is longitudinal backward and frontward of the paper, respectively. It is proper that a width of those openings is set to 20 μm or more. Also, the length of those openings along its longitudinal direction may be set to a required length.

Nickel acetate solution containing nickel elements of 10 ppm in weight conversion therein is coated on the surface. Then, spin dry is conducted using a spinner not shown to remove a surplus solution. The amount of introduction of the nickel elements can be controlled by the concentration of the nickel elements contained in the above solution.

Figure 9A:
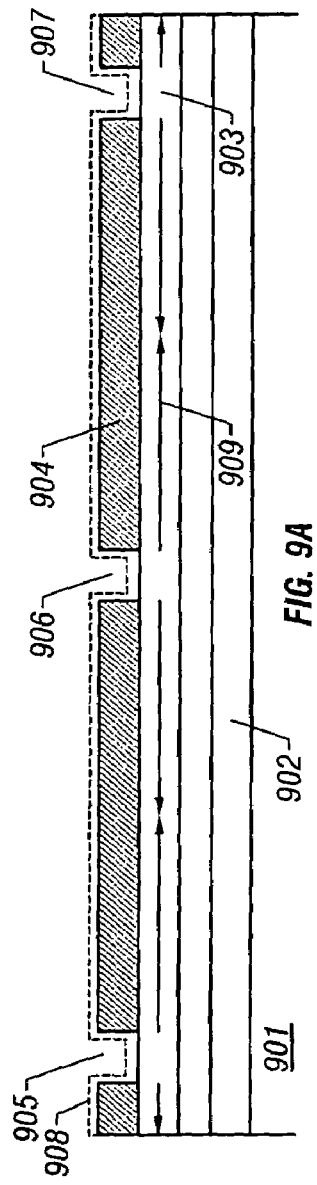
FIGS. 9A and 9B are diagrams showing a process manufacturing the thin film transistor of the third embodiment.

In the above manner, a state in which the nickel elements exist in a state indicated by a dotted line 908 of FIG. 9A is obtained. In this state, the nickel elements are selectively held by a part of the amorphous silicon film on the bottoms of the openings 905 to 907.

The introduction of nickel elements may be conducted through the ion implanting method. In this case, a position at which the nickel elements are introduced can be controlled with higher accuracy in comparison with a case in which a nickel element solution is coated on the surface. Therefore, this is effective particularly in a case where a width of a region into which the nickel elements are introduced is extremely narrow to the degree of several μm or less, or in a case where a shape of the introduced region is complicated.

Subsequently, a heat treatment is conducted at 500 to 630° C., for example, 600 ° C. for 8 hours in a nitrogen atmosphere containing hydrogen of 3% but little of oxygen (or in a nitrogen atmosphere). With this process, crystal growth is progressed in parallel to the substrate 901 as indicated by reference numeral 909 in FIG. 9A.

The crystal growth is progressed from a region of the openings 905 to 907 into which the nickel elements are introduced toward their periphery. The crystal growth in parallel to the substrate is called "lateral growth".

Then, the mask 904 which is formed of the silicon oxide film for selectively introducing the nickel elements is removed.

In this state, the nickel elements are segregated in the crystalline silicon film. In particular, the nickel elements exist with a relatively high concentration in the regions where the openings 905 to 907 are defined and in the regions of a top portion of the crystal growth and with which crystal growth is collided.

Therefore, in the formation of the active layer, it is important to prevent those regions. That is, the regions in which the nickel elements are segregated are prevented from existing in the active layer.

After the crystallization has been conducted, a laser beam may be applied to the surface. In other words, crystallization may be further promoted by the application of a laser beam. The application of the laser beam has an effect of diffusing a lump of nickel elements which exist in the film so as to be liable to remove the nickel elements later. Even if a laser beam is applied at this stage, the lateral growth is not further progressed.

The laser beam can be obtained by using an eximer laser having a wavelength of an ultraviolet region. For example, an KrF eximer layer (248 nm in wavelength) or an XeCl eximer laser (308 nm in wavelength) can be used.

Thereafter, a heat treatment is conducted at 950° C. under an oxygen atmosphere containing halogen elements therein, for example, an oxygen atmosphere containing HCl of 3 volume % to form a thermal oxide film not shown having a thickness of 200 Å. With the formation of the thermal oxide film, the thickness of the silicon film is reduced about 100 Å. In other words, the thickness of the silicon film becomes about 400 Å.

In general, the thermal oxide film formed on the surface of the silicon film is designed such that a thickness that rises from the surface of the thermal oxide film is nearly identical with a distance of oxidation which is progressed into the interior of the thermal oxide film. Therefore, for example, if the thermal oxide film of 100 Å is formed on the surface of the silicon film of 100 Å, the thickness of the silicon film is reduced 50 Å, to thereby constitute the silicon film 50 Å in thickness and the thermal oxide film 100 Å in thickness which is formed on the surface of the silicon film.

During the above process, with the formation of the thermal oxide film, the silicon elements having an unstable bonding state in the film is used for the formation of the thermal oxide film. Then, defects in the film are reduced, thereby being capable of obtaining higher crystallinity.

At the same time, the formation of the thermal oxide film and the gettering of the nickel elements from the film due to the action of halogen elements, in this example, chlorine are conducted.

It is needless to say that the nickel elements are taken in the thermal oxide film with a relatively high concentration. Then, the nickel elements in the silicon film are relatively reduced.

Then, the thermal oxide film is removed. As a result, a crystalline silicon film having the reduced concentration of the nickel elements contained therein is obtained.

The crystalline silicon film thus obtained has a structure in which a crystal structure extends in one direction (this direction is identical with an orientation of crystal growth). In other words, a plurality of slender cylindrical crystals are structured to be aligned in parallel through a plurality of grain boundaries that extend in one direction.

Then, patterning is conducted to form a pattern 910 which is formed by a lateral growth region. The island region 910 will be formed into an active layer of the TFT later.

In this process, a pattern is positioned in such a manner that a direction connecting the source region and the drain region is identical with or nearly identical with an orientation of crystal growth. With this process, a direction of moving carriers can be identical with a direction along which crystal lattices continuously extend as a result of which a TFT having a high characteristic can be obtained.

Then, after the formation of the pattern 910, a thermal oxide film 911 is formed in thickness of 300 Å. This thermal oxide film 911 is obtained by conducting a heat treatment of 950° C. in an oxygen atmosphere containing HCl of 0.1 to 10 volume %, for example, 3% therein.

With the formation of the thermal oxide film 911, the thickness of the pattern (a pattern which is formed into an active layer) 910 becomes 250 Å.

In this process, the same effect as the case of forming the thermal oxide film as removed can be obtained. The thermal oxide film 911 is formed into a part of the gate insulating film of the TFT.

In this embodiment, the thickness (250 Å) of the active layer 910 which is formed of the crystalline silicon film as finally obtained is thinner than the thickness (300 Å) of the second thermal oxide film 911. With this structure, there can be obtained an effect for providing a crystal structure having the continuity in a predetermined direction and a crystal structure having the grain boundary that extends in the predetermined direction.

Figure 9B:
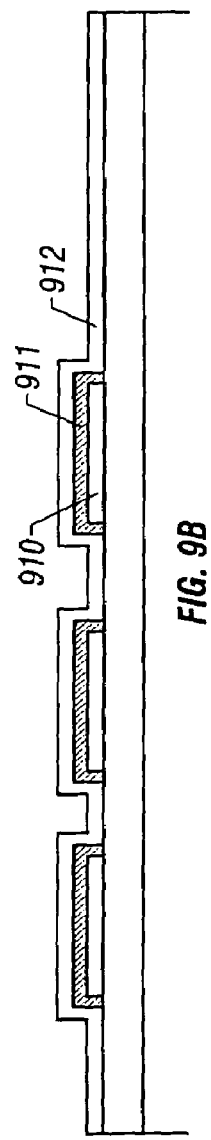

Thereafter, a silicon oxide film 912 that constitutes the thermal oxide film as well as the gate insulating film is formed in thickness of 1,000 Å through the plasma CVD method (FIG. 9B).

The concentration of nickel that finally remains in the silicon film is about $1\times10^{14}$ atm/cm$^3$ to $5\times10^{18}$ atm/cm$^3$ in the existing circumstances, but more preferable as it is low. Reviewing the best condition of gettering the thermal oxide film, an upper limit of the concentration can be reduced up to about $5\times10^{17}$ atm/cm$^3$. The measurement of the concentration can be performed employing an SIMS (secondary ion mass spectroscopy).

Then, an aluminum film for forming a gate electrode is formed in thickness of 4,000 Å through the sputtering method. Scandium of 0.2 weight % gets contained in the aluminum film.

The reason why scandium is contained in the aluminum film is to suppress the occurrence of hillock or whisker during a post-process. The hillock and whisker are directed to a needle-shaped or shaped projection which is caused by abnormal growth of aluminum during heating.

A material used for forming the gate electrode other than aluminum may be tantalum (Ta), polycrystal silicon which is doped with a large amount of phosphorus (P), silicide of tungsten (WSi), or a lamination layer or mixture of polycrystal silicon which is doped with phosphorus and silicide of tungsten.

After the formation of the aluminum film, a fine anodic oxide film not shown is formed. The anodic oxide film is formed in an ethylene glycol solution containing tartaric acid of 3% therein as an electrolyte with aluminum as an anode and platinum as a cathode. In this process, the anodic oxide film having a fine quality is formed in thickness of 100 Å on the aluminum film.

The anodic oxide film not shown serves to improve an adhesion to a resist mask which will be formed later.

The thickness of the anodic oxide film can be controlled according to a supply voltage during anodic oxidation.

Figure 10A:
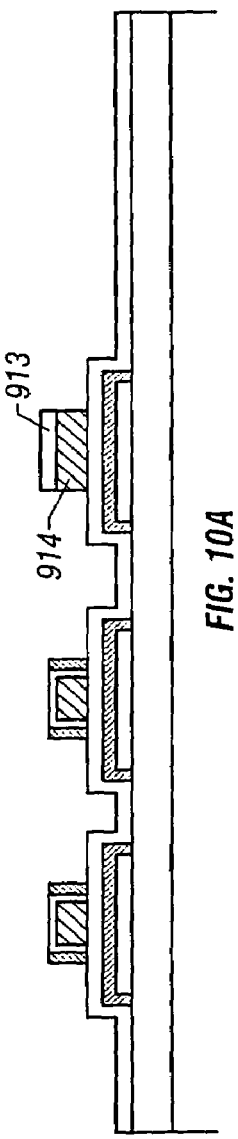
FIGS. 10A and 10B are diagrams showing a process manufacturing the thin film transistor of the third embodiment.

Subsequently, a resist mask 913 is formed. Then, using the resist mask 913, the aluminum film is patterned into a pattern 914. Thus, a state shown in FIG. 10A is obtained.

In this stage, anodic oxidation is again conducted. In this situation, oxalic acid aqueous solution of 3% is used as an electrolyte. In the electrolyte, anodic oxidation is conducted with the aluminum pattern 914 as an anode, to thereby form a porous anodic oxide film 915.

In this process, the anodic oxide film 915 is selectively formed on the side surfaces of the aluminum pattern because the high-adhesive resist mask 906 exists on the upper side.

The porous anodic oxide film can be allowed to grow up to several μm in thickness. In this example, the thickness of the porous anodic oxide film 916 is set to 6,000 Å. The growth distance can be controlled according to an anodic oxidizing time.

Then, the resist mask 914 is removed. Thereafter, a fine anodic oxide film is again formed. In other words, anodic oxidation is again conducted in the above-mentioned ethylene glycol solution containing tartaric acid of 3% therein.

Figure 10B:
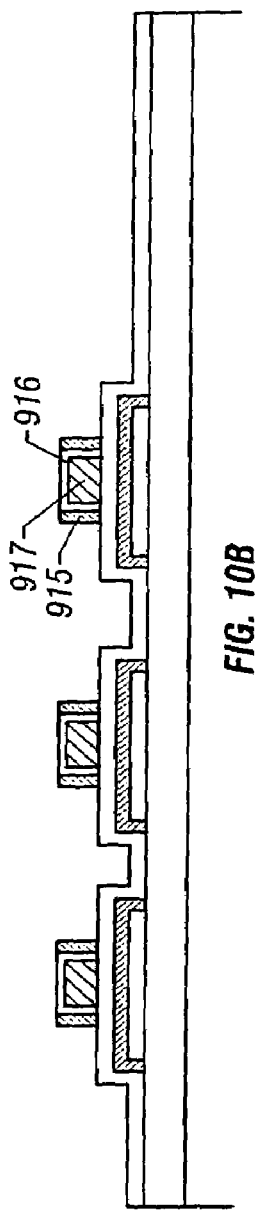

In this process, an anodic oxide film 916 having a fine quality as shown in FIG. 10B is formed because the electrolyte enters the porous anodic oxide film 915.

The thickness of the fine anodic oxide film 916 is set to 1,000 Å. The thickness of the fine anodic oxide film can be controlled according to a supply voltage.

In this situation, the exposed silicon oxide film 912 is etched. At the same time, the thermal oxide film 911 is etched. Etching as conducted is dry etching. Then, using a mixed acid where acetic acid, nitric acid and phosphoric acid are mixed together, the porous anodic oxide film 915 is removed. Thus, a state shown in FIG. 11A is obtained.

Figure 11A:
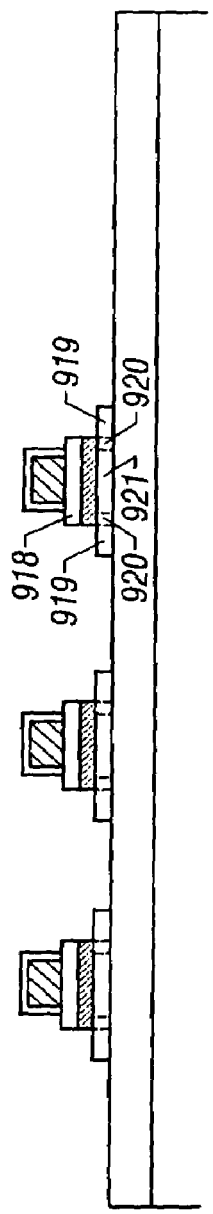
FIGS. 11A and 11B are diagrams showing a process manufacturing the thin film transistor of the third embodiment.

After the state shown in FIG. 11A is obtained, impurity ions are implanted. In this example, in order to fabricate an n-channel type thin film transistor, P (phosphorus) ions are implanted through the plasma doping method.

In this process, a region 919 which is heavy-doped and a region 920 which are light-doped are formed. This is because the remaining silicon oxide film 918 functions as a semi-transparent mask, and a part of the implanted ions is shielded by the film 918.

Then, a laser beam (or an intense light from a lamp) is applied to activate the region into which the impurity ions are implanted. Thus, a source region/drain region 919, a channel formation region 921, and a low concentration impurity region 920 are formed in a self-aligning manner (FIG. 11A).

In the case where the thickness of the fine anodic oxide film 916 is thickened to 2,000 Å or more, an offset gate region can be formed by this thickness outside of the channel formation region 921.

Similarly, in this embodiment, the offset gate region is formed. However, since its dimensions are small such that a contribution of the offset gate region is small, and also the drawings become complicated, the offset gate region is omitted from the drawing.

In order to make the anodic oxide film having the fine quality thicker to the degree of 2,000 Å or more, since a supply voltage of 200 V or higher is required, attention must be paid to reproducibility and safety.

Subsequently, a silicon oxide film, a silicon nitride film or a lamination film consisting of those films is formed as an interlayer insulating film 922. The interlayer insulating film may consist of a layer which is made of a resin material on a silicon oxide film or a silicon nitride film.

Figure 11B:
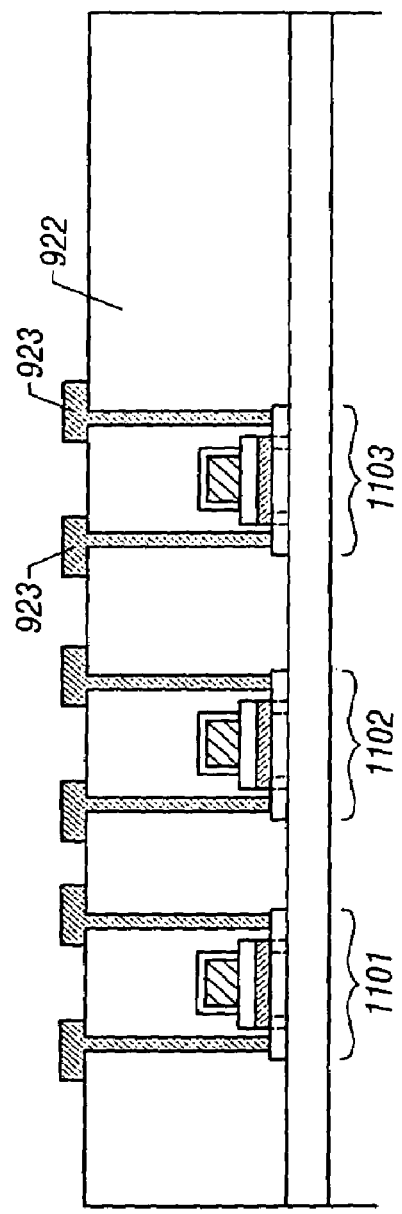

Then, contact holes are formed so that a source electrode/drain electrode 323 are formed. Thus, a thin film transistor shown in FIG. 11B is completed.

The TFT according to this embodiment can obtain an extremely high characteristic which could not be obtained by the conventional TFT.

For example, an NTFT (n-channel type TFT) as manufactured can obtain a high performance such as the mobility of 200 to 300 (cm$^2$/Vs) and the S value of 75 to 90 (mV/dec) (VD=1 V). A PTFT (p-channel type TFT) as manufactured can obtain a high performance such as the mobility of 120 to 180 (cm$^2$/Vs) and the S value of 75 to 100 (mV/dec) (VD=1 V).

In particular, the S value is a wonder excellent value which is ½ or less of that in the conventional high-temperature polysilicon TFT and low-temperature polysilicon TFT.

The TFT thus manufactured can conduct the operation of 1 GHz in a ring oscillator level and the operation of 100 MHz in the shift register level when a voltage of the drive signal is 3.3 to 5 V.

Also, with the existence of the dummy nickel added region 907, a distance of crystal growth of the silicon film that constitutes a semiconductor layer of the TFT 1103 can be made sufficiently long, thereby being capable of providing a TFT having the above characteristics.

Further, if the intervals between the respective nickel added regions are unified, the characteristics of the TFTs 1101 to 1103 can be unified.

Also, the thin film transistor employing the crystalline silicon film having the above singular crystal structure is characterized in that the crystal structure makes it hard to exhibit the short channel effect. Also, it is characterized in that since an insulator is used as a substrate, there rises no problem on the capacity of the substrate, and it is suitable for high-speed operation.

Moreover, in the case of using a crystalline silicon film having the above singular crystal structure, a required characteristic can be obtained by the dimensions which are not complied with the above scaling rule.

Fourth Embodiment

Figure 12:
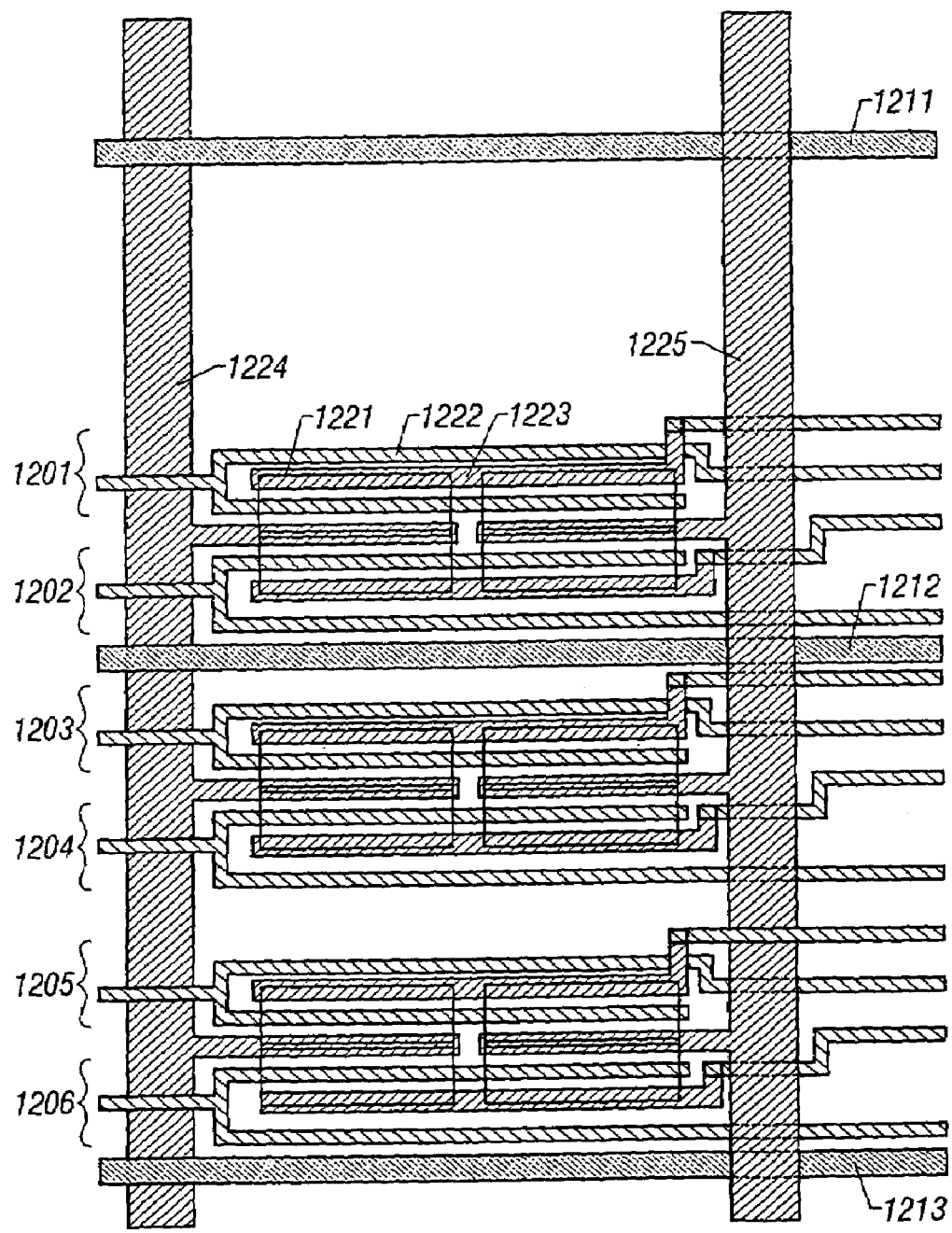
FIG. 12 is a diagram showing an arrangement of nickel added regions and TFTs in a buffer circuit section of the fourth embodiment.
Figure 13:
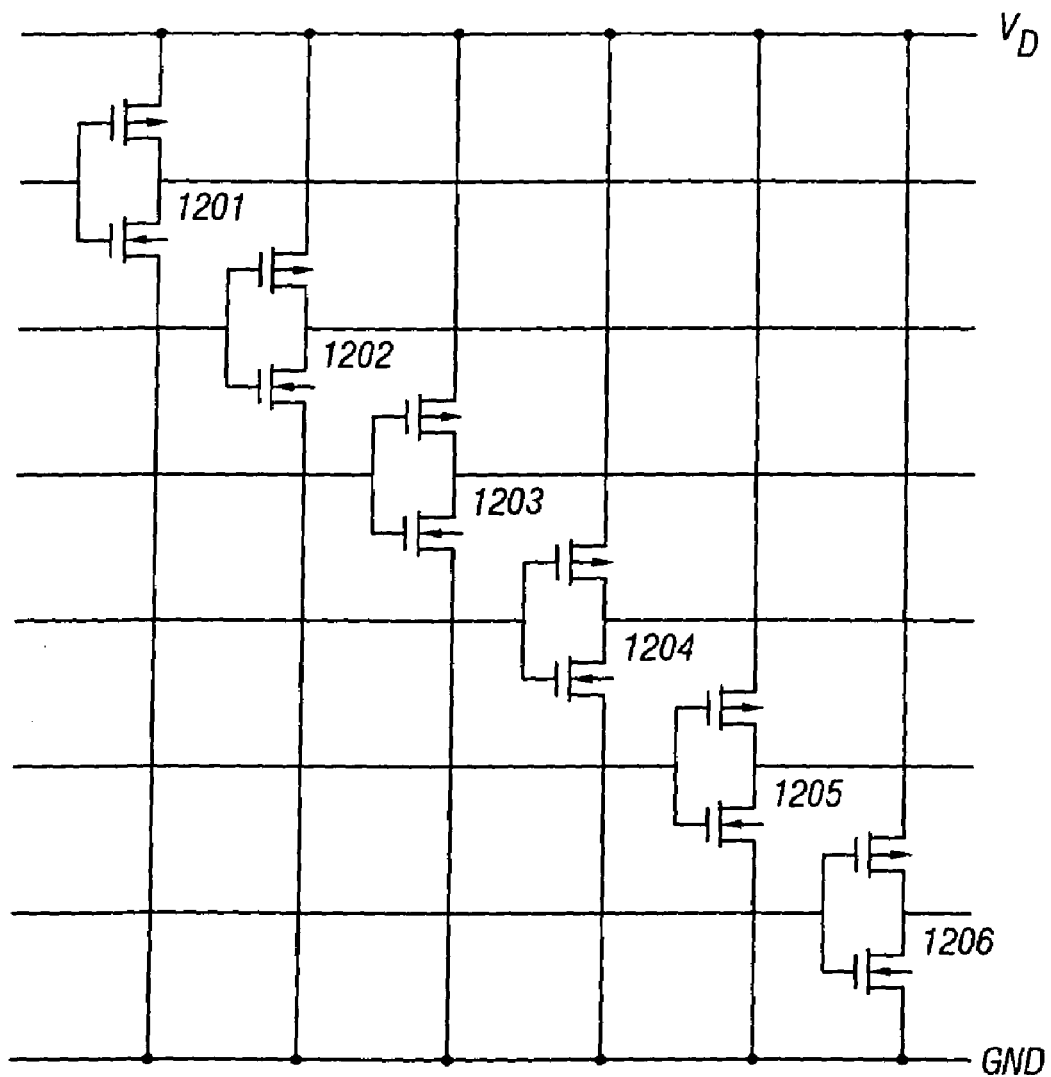
FIG. 13 is an equivalent circuit of FIG. 12.

What is shown in FIG. 12 is a diagram showing a part of a buffet circuit section within a source driver circuit in a liquid-crystal display device. In particular, this figure shows an end portion of the buffer circuit section, in which two inverter circuits 1201 and 1202 are disposed on an endmost portion, and the same circuits and nickel added regions are cyclically arranged on a lower side of the figure. An equivalent circuit diagram of FIG. 12 is shown in FIG. 13.

In FIG. 12, reference numeral 1211, 1212 and 1213 denote nickel added regions. Also, reference numeral 1221 denotes a pattern of a crystalline silicon film, 1222 is a gate line, 1223 to 1225 are source or drain lines.

The characteristics of the TFT that constitutes inverter circuits (for example, 1203, 1204 and so on) fabricated under the nickel added region 1212 are sufficient. This is because since they are disposed between the respective nickel added regions, a distance of crystal growth of the silicon film in the region therebetween is sufficient.

Also, since intervals between the respective nickel added regions are unified, the characteristics of the TFTs are also substantially identical with each other.

On the other hand, the inverter circuits 1201 and 1202 are circuits disposed on the endmost portion, and in order to obtain a sufficient characteristic of the TFTs that constitute those circuits, a dummy nickel added region 1211 is disposed as shown in FIG. 12.

In particular, an object of this embodiment is to obtain a sufficient characteristic of the TFT that constitutes the inverter circuit 1201 which is disposed on the endmost portion. This is because in the case where crystal growth is insufficient, the characteristic of the above TFT is most deteriorated.

In this example, the respective intervals between the nickel added regions 1211 to 1213 are made identical with each other.

Since the dummy nickel added region 1211 is disposed as mentioned above, the distance of crystal growth of the silicon film in the regions where the TFTs that constitute the inverter circuits 1201 and 1202 are disposed is made sufficiently long, thereby being capable of obtaining a sufficient characteristic of the TFTS.

The, the operating speed of the inverter circuits 1201 and 1202 which are disposed on the endmost portion can be sufficiently increased.

Fifth Embodiment

This embodiment exhibits an example in which a glass substrate is used as a substrate. In this embodiment, without conducting a process of forming a thermal oxide film that requires processing at a high temperature, instead, a crystalline silicon film where crystal grows in parallel to the substrate is obtained by application of a laser beam.

In other words, there are applied processes such as the selective introduction of nickel elements into the amorphous silicon film, crystal growth in parallel to the substrate by a heat treatment at 600° C. for 8 hours, and laser annealing conducted on a crystal growth region.

A relation between a position of the region where nickel elements are added and a position at which the active layer is formed is identical with that described with reference to other embodiments.

Sixth Embodiment

In this embodiment, the structure described in the first to fifth embodiments is made up of inverted stagger type thin film transistors. Even if the planner type thin film transistor in the respective embodiments is replaced by the inverted stagger type thin film transistor, the same effect can be obtained.

As the gate electrode of the inverted stagger type thin film transistor, to use a material high in heat resistance, for example, polycrystal silicon which is doped with a large amount of phosphorus for the gate electrode is effective in obtaining a high-performance thin film transistor.

Seventh Embodiment

In this embodiment, examples of applied products using the semiconductor device according to the present invention will be described.

Figure 14A:
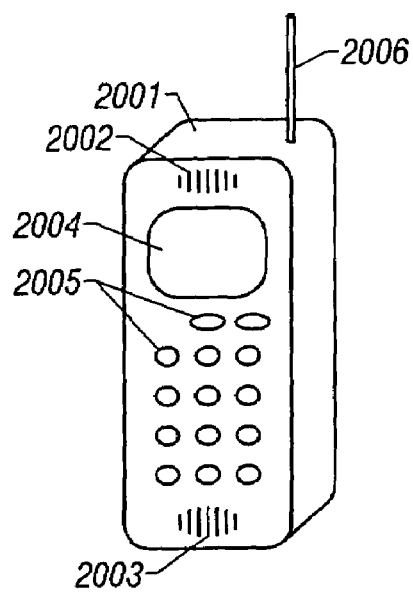
FIGS. 14A to 14F are diagrams showing applied products using a semiconductor device of the seventh embodiment of the present invention.

FIG. 14A shows a portable telephone which is made up of a main body 2001, a voice output section 2002, a voice input section 2003, a display unit 2004, an operating switch 2005, and an antenna 2006. The present invention is applicable to the display unit 2004.

Figure 14B:
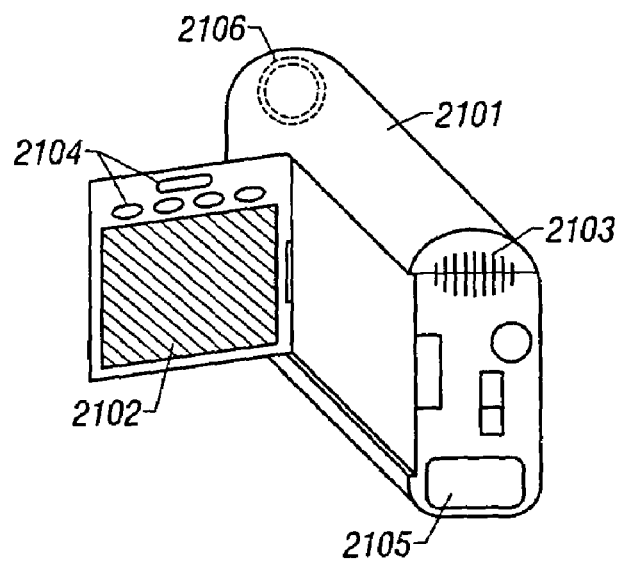

FIG. 14B shows a video camera which is made up of a main body 2101, a display unit 2102, a voice input section 2103, an operating switch 2104, a battery 2105, and an image receiving section 2106. The present invention is applicable to the display unit 2102.

Figure 14C:
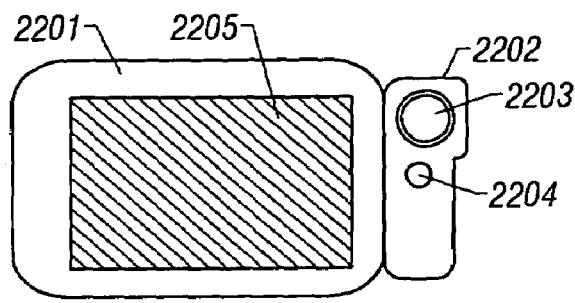

FIG. 14C shows a mobile computer which is made up of a main body 2201, a camera section 2202, an image receiving section 2203, an operating switch 2204, and a display unit 2205. The present invention is applicable to the display unit 2205.

Figure 14D:
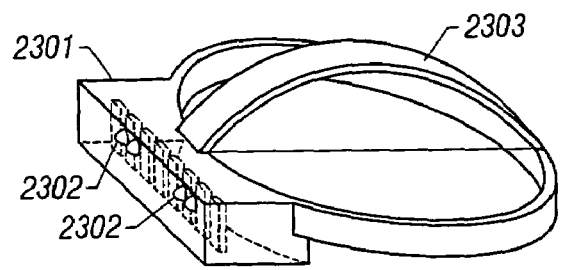

FIG. 14D shows a head mountain display which is made up of a main body 2301, a display unit 2302, and a band section 2303. The present invention is applicable to the display unit 2302.

Figure 14E:
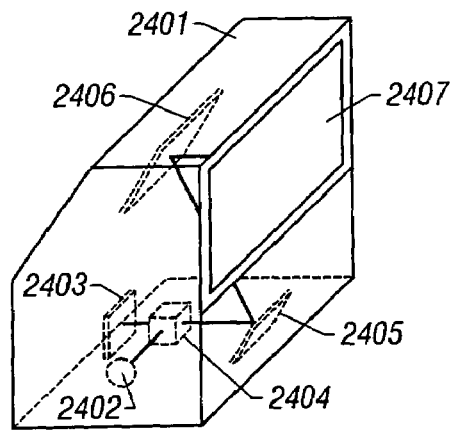

FIG. 14E shows a rear type projector which is made up of a main body 2401, a light source 2402, a display unit 2403, a polarizing beam splitter 2404, reflectors 2405, 2406, and a screen 2407. The present invention is applicable to the display unit 2403.

Figure 14F:
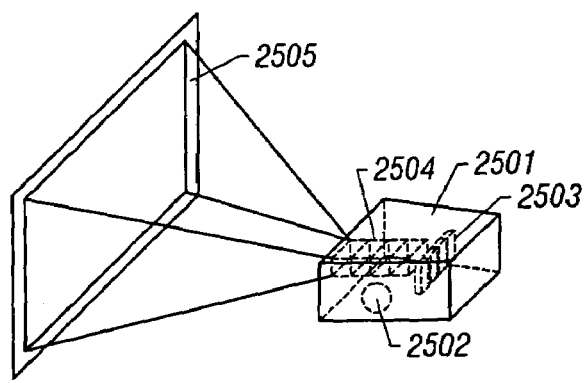

FIG. 14F shows a front type projector which is made up of a main body 2501, a light source 2502, a display unit 2503, an optical system 2504, and a screen 2505. The present invention is applicable to the display unit 2503.

In addition, the semiconductor device of the present invention is available in applied products such as a personal computer or a portable information terminal equipment. As described above, the semiconductor device according to the present invention is applicable over a broad field.

Figure 1A:
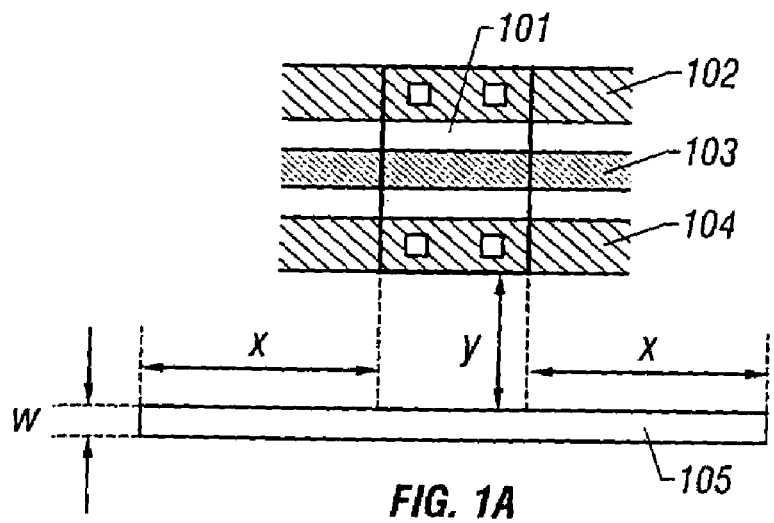
FIGS. 1A and 1B are a top view schematically showing the present invention and a diagram showing a conventional example, respectively.
Figure 1B:
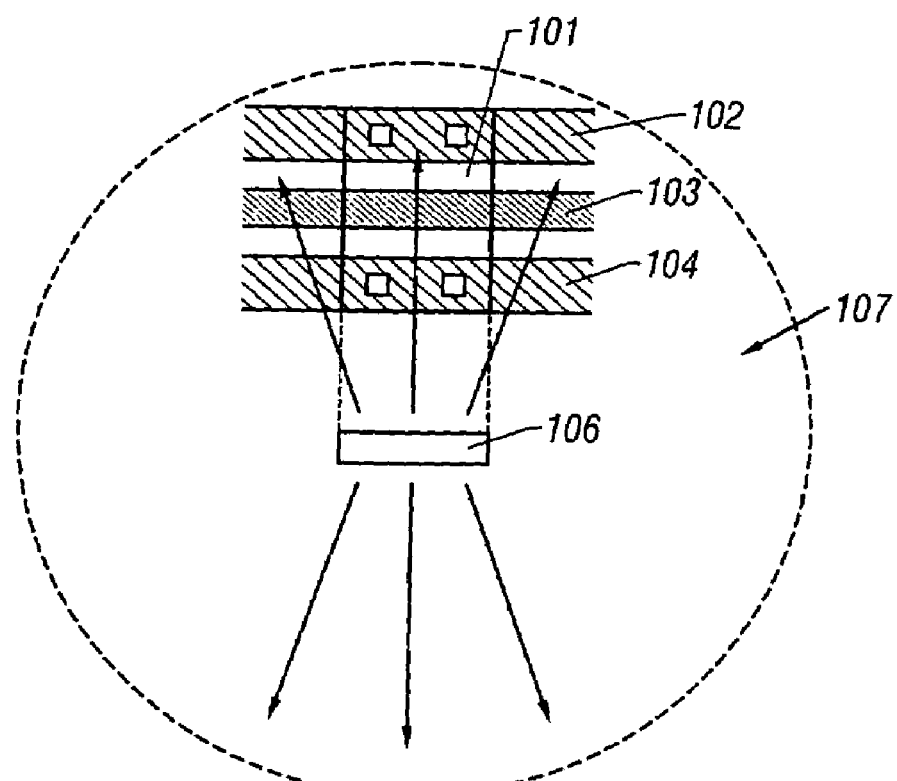
Figure 2A:
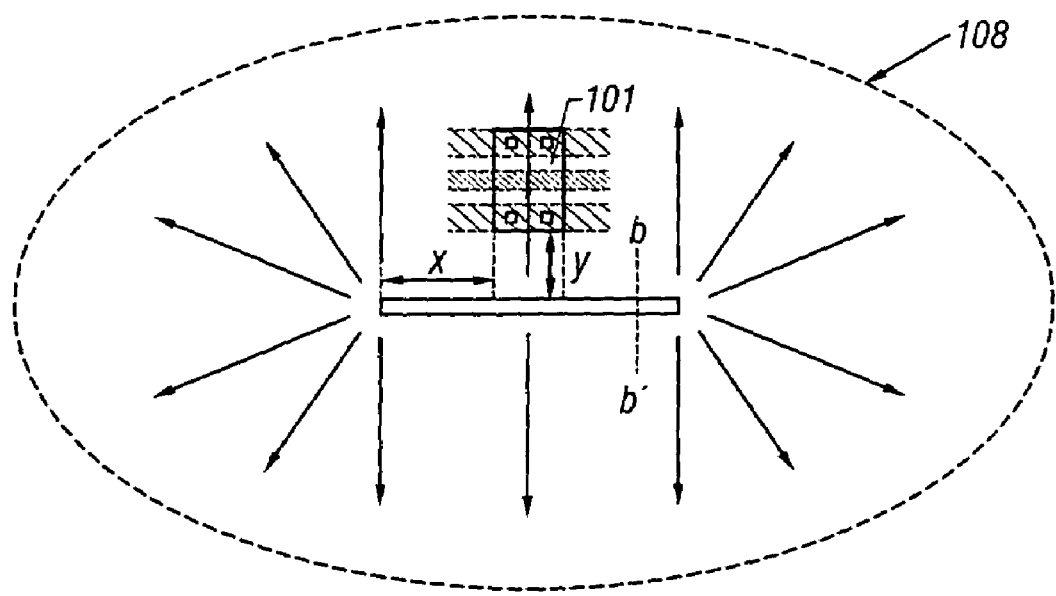
FIGS. 2A and 2B are diagrams showing a metal element diffusion state.
Figure 2B:
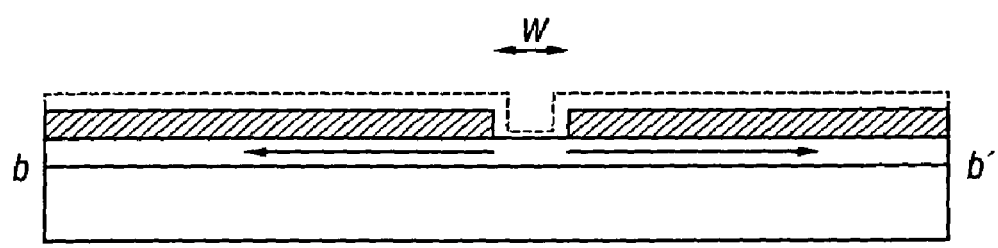

As was described above, according to the present invention, since the metal added region takes a margin of the distance x so as to be longer from the end portion of the semiconductor island region 101 longitudinally, the diffusion state shown in FIG. 2A is obtained. Then, using the region where a direction of extending the grain boundary of the semiconductor region 101 is substantially linear (one dimensional), the thin film transistor can be manufactured.

Since the semiconductor region of the present invention is designed such that an orientation of crystallization is linear in comparison with the conventional high-temperature polysilicon TFT and low-temperature polysilicon TFT, the same high-speed operation as that of a monocrystal MOSFET can be obtained.

Also, a higher-speed operation can be obtained since a direction of moving the carriers in the semiconductor island region that constitutes the thin film transistor (a carrier moving direction as a whole) is nearly identical with a direction of the continuity of the crystal structure.

With the structure of the present invention, the characteristics of the transistor can be improved, and a uniform characteristic can be obtained. Further, uniformity of writing an image signal or the like can be kept in the semiconductor device that forms a peripheral circuit.

Also, according to the present invention, there can be provided a TFT which corrects a difference in crystal growth due to a distance between the nickel added regions and is uniform in characteristic using the crystalline silicon film which is fabricated by utilizing nickel addition. In particular, a distance of crystal growth in the region which is not interposed between the nickel added regions can be made sufficiently long.

Then, in the liquid-crystal display device, the operating characteristics of the circuits of the same type can be identified so that a large number of pixels can be operated in the same manner.

The present invention not only constitutes the peripheral circuit formed on the same substrate as the active matrix circuit in the transmission type or reflection type active matrix liquid-crystal display device, but also is applicable to a display unit employing an EL (electro luminescence) element and a variety of circuits using the thin film transistors.

What is claimed is:

1. A method of manufacturing a semiconductor device, said method comprising:
   forming an amorphous semiconductor film on an insulating surface;
   providing a metal element being capable of promoting crystallization of the amorphous semiconductor film to form a first metal element added region and a second metal element added region;
   crystallizing the amorphous semiconductor film from the first metal element added region and the second metal element added region in parallel to the substrate to form a first crystalline portion and a second crystalline portion, respectively, in a crystalline semiconductor film; and
   patterning the crystalline semiconductor film to form at least one crystalline semiconductor island of a functional array of semiconductor islands using the first crystalline portion while the second crystalline portion is not used to form any crystalline semiconductor island of the functional array of semiconductor islands,
   wherein the second crystalline portion is located between the crystalline semiconductor island and the second metal element added region, and
   wherein the first metal element added region is away from the second metal element added region.

2. The method according to claim 1,
   wherein lengths of the first metal element added region and the second element added region are set to 50% or more of a crystal growth distance.

3. The method according to claim 1,
   wherein the metal element comprises at least one selected from Fe, Co, Ni, Ru, Rh, Pd, Os, Ir, Pt, Cu and Au.

4. The method according to claim 1,
   wherein the amorphous semiconductor film comprises silicon.

5. The method according to claim 1,
   wherein the semiconductor device includes at least one selected from the group consisting of an n-channel thin film transistor and a p-channel thin film transistor,
   wherein the n-channel thin film transistor has a first S value not higher than 90 mV/dec while the p-channel thin film transistor has a second S value not higher than 100 mV/dec.

6. The method according to claim 1,
   wherein the semiconductor device includes at least one selected from the group consisting of an n-channel thin film transistor and a p-channel thin film transistor,
   wherein the n-channel thin film transistor has a first S value not lower than 75 mV/dec while the p-channel thin film transistor has a second S value not lower than 75 mV/dec.

7. The method according to claim 1,
   wherein at least one of the metal element added regions has length extending 100 µm or more longer from an end portion of the crystalline semiconductor island in a longitudinal direction of the first metal element added region.

8. A method of manufacturing a semiconductor device, said method comprising:
   forming an amorphous semiconductor film on an insulating surface;
   providing a metal element being capable of promoting crystallization of the amorphous semiconductor to form a first metal element added region and a second metal element added region;
   crystallizing the amorphous semiconductor film from the first metal element added region and the second metal element added region in parallel to the substrate to form a first crystalline portion and a second crystalline portion, respectively, in a crystalline semiconductor film; and
   patterning the crystalline semiconductor film to form at least one crystalline semiconductor island of a functional array of semiconductor islands, using the first crystalline portion while the second crystalline portion is not used to form any crystalline semiconductor island of the functional array of semiconductor islands,
   wherein the second crystalline semiconductor region is located at a peripheral edge of the functional array of semiconductor islands, and
   wherein the first metal element added region is away from the second metal element added region.

9. The method according to claim 8,
wherein the metal element comprises at least one selected from Fe, Co, Ni, Ru, Rh, Pd, Os, Ir, Pt, Cu and Au.

10. The method according to claim 8,
wherein the metal element is provided by an ion implanting method.

11. The method according to claim 8,
wherein the metal element is provided by coating a solvent comprising the metal element.

12. The method according to claim 8,
wherein the amorphous semiconductor film comprises silicon.

13. The method according to claim 8,
wherein the semiconductor device includes at least one selected from the group consisting of an n-channel thin film transistor and a p-channel thin film transistor,
wherein the n-channel thin film transistor has a first S value not higher than 90 mV/dec while the p-channel thin film transistor has a second S value not higher than 100 mV/dec.

14. The method according to claim 8,
wherein the semiconductor device includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.

15. The method according to claim 8,
wherein crystal growth state is controlled by the second metal element added region.

16. The method according to claim 8,
wherein at least one of the metal element added regions has length extending 100 μm or more longer from an end portion of the crystalline semiconductor island in a longitudinal direction of the first metal element added region.

17. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first crystalline portion and a second crystalline portion, respectively, in a crystalline semiconductor film; and
patterning the crystalline semiconductor film to form at least one crystalline semiconductor island of a functional array of semiconductor islands using the first crystalline portion while the second crystalline portion is not used to form any crystalline semiconductor island of the functional array of semiconductor islands,
wherein the second crystalline portion extends along an entire length of the second metal element added region, and
wherein the first metal element added region is away from the second metal element added region.

18. The method according to claim 17,
wherein the metal element comprises at least one selected from Fe, Co, Ni, Ru, Rh, Pd, Os, Ir, Pt, Cu and Au.

19. The method according to claim 17,
wherein the metal element is provided by an ion implanting method.

20. The method according to claim 17,
wherein the metal element is provided by coating a solvent comprising the metal element.

21. The method according to claim 17,
wherein the amorphous semiconductor film comprises silicon.

22. The method according to claim 17,
wherein the semiconductor device includes at least one selected from the group consisting of an n-channel thin film transistor and a p-channel thin film transistor,
wherein the n-channel thin film transistor has a first S value not higher than 90 mV/dec while the p-channel thin film transistor has a second S value not higher than 100 mV/dec.

23. The method according to claim 17,
wherein the semiconductor device includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.

24. The method according to claim 17,
wherein at least one of the metal element added regions has length extending 100 μm or more longer from an end portion of the crystalline semiconductor island in a longitudinal direction of the first metal element added region.

25. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first crystalline portion and a second crystalline portion, respectively, in a crystalline semiconductor film; and
patterning the crystalline semiconductor film to form at least one crystalline semiconductor island of a group of active elements using the first crystalline portion while the second crystalline portion is not used to form any crystalline semiconductor island of the group of active elements,
wherein the second crystalline portion is located between the crystalline semiconductor island and the second metal element added region, and
wherein the first metal element added region is away from the second metal element added region.

26. The method according to claim 25,
wherein lengths of the metal element added regions are set to 50% or more of a crystal growth distance.

27. The method according to claim 25,
wherein the metal element comprises at least one selected from Fe, Co, Ni, Ru, Rh, Pd, Os, Ir, Pt, Cu and Au.

28. The method according to claim 25,
wherein the metal element is provided by an ion implanting method.

29. The method according to claim 25,
wherein the metal element is provided by coating a solvent comprising the metal element.
30. The method according to claim 25,
wherein the amorphous semiconductor film comprises silicon.
31. The method according to claim 25,
wherein the semiconductor device includes at least one selected from the group consisting of an n-channel thin film transistor and a p-channel thin film transistor,
wherein the n-channel thin film transistor has a first S value not higher than 90 mV/dec while the p-channel thin film transistor has a second S value not higher than 100 mV/dec.
32. The method according to claim 25,
wherein the semiconductor device includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.
33. The method according to claim 25,
wherein crystal growth state is controlled by the metal element added region that is not used to form crystalline semiconductor islands.
34. The method according to claim 25,
wherein at least one of the metal element added regions has length extending 100 μm or more longer from an end portion of the crystalline semiconductor island in a longitudinal direction of the first metal element added region.
35. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first portion and a second crystalline portion, respectively, in a crystalline semiconductor film; and
patterning the crystalline semiconductor film to form at least one crystalline semiconductor island of a group of active elements using the first crystalline portion while the second crystalline portion is not used to form any crystalline semiconductor island of the group of active elements,
wherein the second crystalline portion is located at a peripheral edge of the group of active elements, and
wherein the first metal element added region is away from the second metal element added region.
36. The method according to claim 35,
wherein the metal element comprises at least one selected from Fe, Co, Ni, Ru, Rh, Pd, Os, Ir, Pt, Cu and Au.
37. The method according to claim 35,
wherein the metal element is provided by an ion implanting method.
38. The method according to claim 35,
wherein the metal element is provided by coating a solvent comprising the metal element.
39. The method according to claim 35,
wherein the amorphous semiconductor film comprises silicon.
40. The method according to claim 35,
wherein the semiconductor device includes at least one selected from the group consisting of an n-channel thin film transistor and a p-channel thin film transistor,
wherein the n-channel thin film transistor has a first S value not higher than 90 mV/dec while the p-channel thin film transistor has a second S value not higher than 100 mV/dec.
41. The method according to claim 35,
wherein the semiconductor device includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.
42. The method according to claim 35,
wherein crystal growth state is controlled by the metal element added region that is not used to form crystalline semiconductor islands.
43. The method according to claim 35,
wherein at least one of the metal element added regions has length extending 100 μm or more longer from an end portion of the crystalline semiconductor island in a longitudinal direction of the first metal element added region.
44. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first crystalline portion and a second crystalline portion, respectively, in a crystalline semiconductor film; and
patterning the crystalline semiconductor film to form at least one crystalline semiconductor island of a group of active elements using the first crystalline portion while the second crystalline portion is not used to form any crystalline semiconductor island of the group of active elements,
wherein the second crystalline portion extends along an entire length of the second metal element added region, and
wherein the first metal added region is away from the second metal element added region.
45. The method according to claim 44,
wherein the metal element comprises at least one selected from Fe, Co, Ni, Ru, Rh, Pd, Os, Ir, Pt, Cu and Au.
46. The method according to claim 44,
wherein the metal element is provided by an ion implanting method.
47. The method according to claim 44,
wherein the metal element is provided by coating a solvent comprising the metal element.
48. The method according to claim 44,
wherein the amorphous semiconductor film comprises silicon.
49. The method according to claim 44,
wherein the inverter circuit includes at least one selected from the group consisting of an n-channel thin film transistor and a p-channel thin film transistor, wherein the n-channel thin film transistor has a first S value not higher than 90 mV/dec while the p-channel thin film transistor has a second S value not higher than 100 mV/dec.

50. The method according to claim 44,
wherein the inverter circuit includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.

51. The method according to claim 44,
wherein at least one of the metal element added regions has length extending 100 μm or more longer from an end portion of the crystalline semiconductor island in a longitudinal direction of the first metal element added region.

52. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first crystalline portion and a second crystalline portion, respectively, in a crystalline semiconductor film; and
patterning the crystalline semiconductor film to form at least one crystalline semiconductor island of a functional array of semiconductor islands using the first crystalline portion while the second crystalline portion is not used to form any crystalline semiconductor island of the functional array of semiconductor islands,
wherein the second crystalline portion is located between the crystalline semiconductor island and the second metal element added region,
wherein the first metal element added region is away from the second metal element added region, and
wherein the crystalline semiconductor island constitutes a TFT of an inverter circuit.

53. The method according to claim 52,
wherein lengths of the metal element added regions are set to 50% or more of a crystal growth distance.

54. The method according to claim 52,
wherein the metal element comprises at least one selected from Fe, Co, Ni, Ru, Rh, Pd, Os, Ir, Pt, Cu and Au.

55. The method according to claim 52,
wherein the metal element is provided by an ion implanting method.

56. The method according to claim 52,
wherein the metal element is provided by coating a solvent comprising the metal element.

57. The method according to claim 52,
wherein the amorphous semiconductor film comprises silicon.

58. The method according to claim 52,
wherein the inverter circuit includes at least one selected from the group consisting of an n-channel thin film transistor and a p-channel thin film transistor,
wherein the n-channel thin film transistor has a first S value not higher than 90 mV/dec while the p-channel thin film transistor has a second S value not higher than 100 mV/dec.

59. The method according to claim 52,
wherein the inverter circuit includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.

60. The method according to claim 52,
wherein crystal growth state is controlled by the metal element added region that is not used to form crystalline semiconductor islands.

61. The method according to claim 52,
wherein at least one of the metal element added regions has length extending 100 μm or more longer from an end portion of the crystalline semiconductor island in a longitudinal direction of the first metal element added region.

62. A method of manufacturing a semiconductor device, said method comprising:
forming an amorphous semiconductor film on an insulating surface;
providing a metal element being capable of promoting crystallization of the amorphous semiconductor film to form a first metal element added region and a second metal element added region;
crystallizing the amorphous semiconductor film from the first metal element added region and the second metal element added region in parallel to the substrate to form a first crystalline portion and a second crystalline portion, respectively, in a crystalline semiconductor film; and
patterning the crystalline semiconductor film to form at least one crystalline semiconductor island of a group of active elements using the first crystalline portion while the second crystalline portion is not used to form any crystalline semiconductor island of the group of active elements,
wherein the second crystalline portion is located between the crystalline semiconductor island and the second metal element added region,
wherein the first metal element added region is away from the second metal element added region, and
wherein the crystalline semiconductor island constitutes a TFT of an inverter circuit.

63. The method according to claim 62,
wherein the metal element comprises at least one selected from Fe, Co, Ni, Ru, Rh, Pd, Os, Ir, Pt, Cu and Au.

64. The method according to claim 62,
wherein the metal element is provided by an ion implanting method.

65. The method according to claim 62,
wherein the metal element is provided by coating a solvent comprising the metal element.

66. The method according to claim 62,
wherein the amorphous semiconductor film comprises silicon.

67. The method according to claim 62,
wherein the inverter circuit includes at least one selected from the group consisting of an n-channel thin film transistor and a p-channel thin film transistor, wherein the n-channel thin film transistor has a first S value not higher than 90 mV/dec while the p-channel thin film transistor has a second S value not higher than 100 mV/dec.

68. The method according to claim 62,
wherein the inverter circuit includes at least one selected from the group consisting of an n-channel thin film transistor and a p-channel thin film transistor,
wherein the n-channel thin film transistor has a first S value not lower than 75 mV/dec while the p-channel thin film transistor has a second S value not lower than 75 mV/dec.

69. The method according to claim 62,
wherein crystal growth state is controlled by the metal element added region that is not used to form crystalline semiconductor islands.

70. The method according to claim 62,
wherein at least one of the metal element added regions has length extending 100 μm or more longer from an end portion of the crystalline semiconductor island in a longitudinal direction of the first metal element added region.

* * * * *